United States Patent
Fukuhara et al.

(10) Patent No.: US 8,072,601 B2
(45) Date of Patent: Dec. 6, 2011

(54) PATTERN MONITOR MARK AND MONITORING METHOD SUITABLE FOR MICROPATTERN

(75) Inventors: Kazuya Fukuhara, Tokyo (JP); Kazutaka Ishigo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 846 days.

(21) Appl. No.: 12/037,757

(22) Filed: Feb. 26, 2008

(65) Prior Publication Data

US 2008/0206898 A1 Aug. 28, 2008

(30) Foreign Application Priority Data

Feb. 28, 2007 (JP) ................. 2007-050436
Mar. 22, 2007 (JP) ................. 2007-075480

(51) Int. Cl.
*G01B 11/00* (2006.01)
*G01B 11/14* (2006.01)
*H01L 21/00* (2006.01)
*H01L 21/66* (2006.01)
*G01R 31/26* (2006.01)

(52) U.S. Cl. ............ 356/401; 356/614; 356/620; 438/7; 438/16

(58) Field of Classification Search .......... None
See application file for complete search history.

(56) References Cited

U.S. PATENT DOCUMENTS

| | | | |
|---|---|---|---|
| 5,328,810 A | 7/1994 | Lowrey et al. | |
| 7,115,525 B2 | 10/2006 | Abatchev et al. | |
| 7,751,046 B2 * | 7/2010 | Levy et al. | 356/401 |
| 2001/0048145 A1 * | 12/2001 | Takeuchi et al. | 257/620 |
| 2002/0131055 A1 * | 9/2002 | Niu et al. | 356/603 |
| 2006/0064193 A1 * | 3/2006 | Yamashita et al. | 700/121 |
| 2006/0194429 A1 | 8/2006 | Hashimoto et al. | |
| 2006/0211260 A1 | 9/2006 | Tran et al. | |
| 2006/0234165 A1 | 10/2006 | Kamigaki et al. | |
| 2007/0238053 A1 | 10/2007 | Hashimoto | |
| 2010/0316958 A1 * | 12/2010 | Fu et al. | 430/319 |

FOREIGN PATENT DOCUMENTS

| | | |
|---|---|---|
| JP | 2002-280388 | 9/2002 |
| JP | 2006-303022 | 11/2006 |

* cited by examiner

*Primary Examiner* — Tarifur Chowdhury
*Assistant Examiner* — Gordon Stock, Jr.
(74) *Attorney, Agent, or Firm* — Finnegan, Henderson, Farabow, Garrett & Dunner, L.L.P.

(57) ABSTRACT

A method of forming a monitor mark includes forming an insulating film on a semiconductor substrate, and forming a first repetitive line pattern group and a second repetitive line pattern group by patterning the insulating film on the semiconductor substrate, such that the first repetitive line pattern group and the second repetitive line pattern group face each other with a predetermined space therebetween.

9 Claims, 22 Drawing Sheets

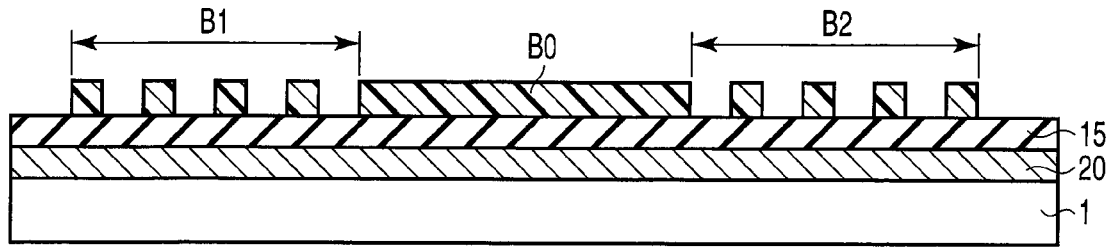
F I G. 6
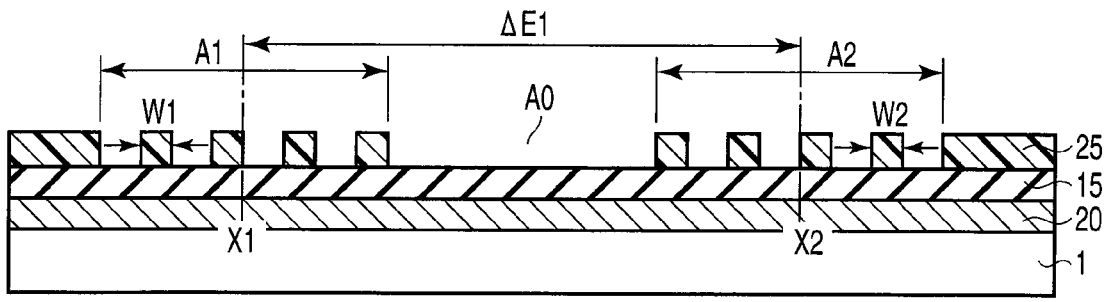
F I G. 7
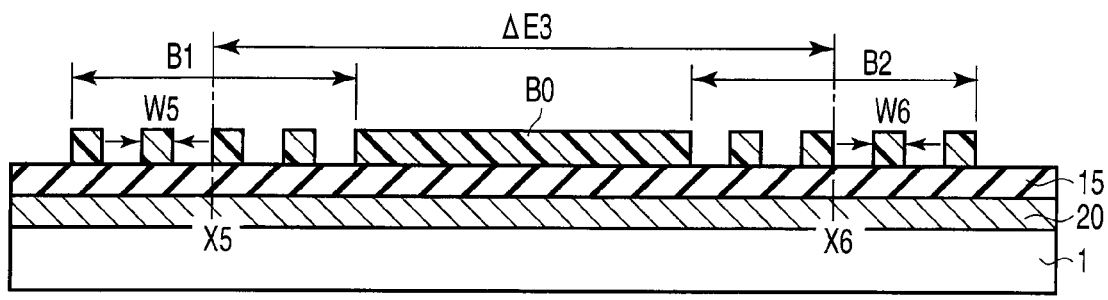
F I G. 8
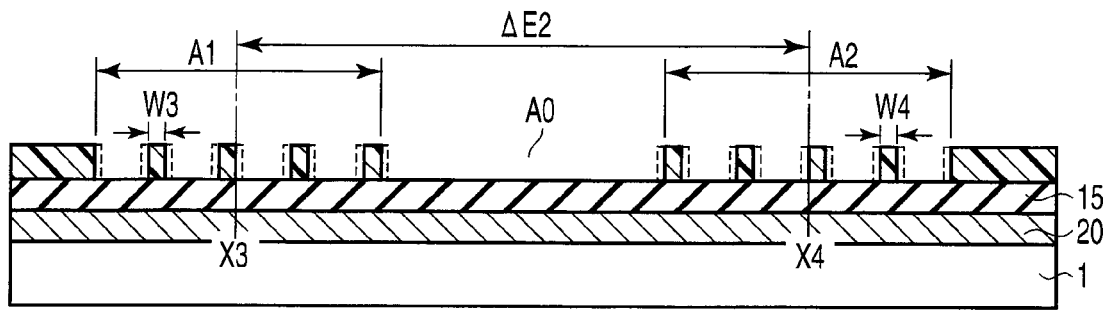
F I G. 9

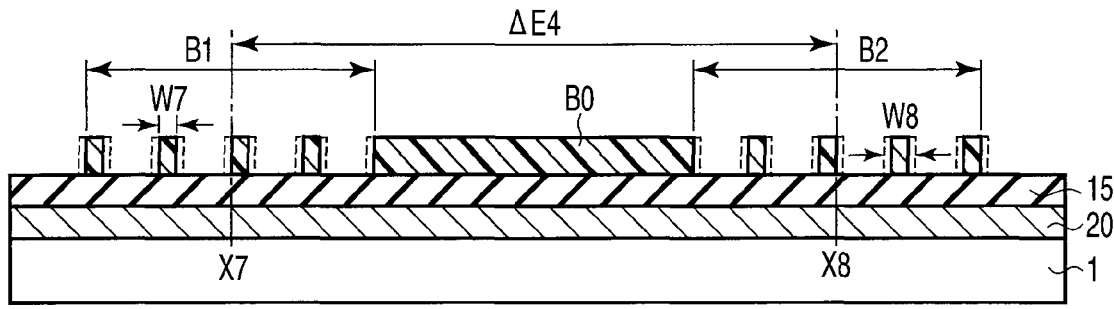
F I G. 10
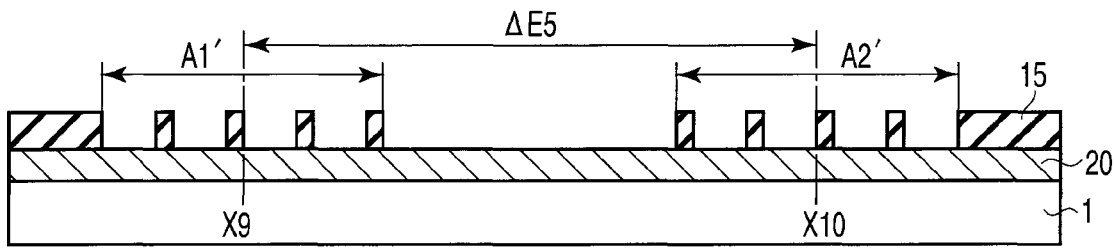
F I G. 11A
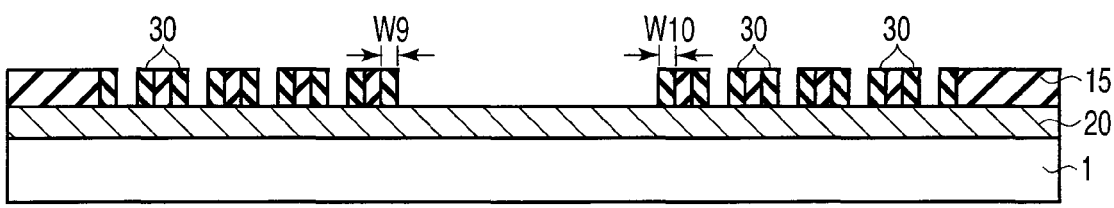
F I G. 11B
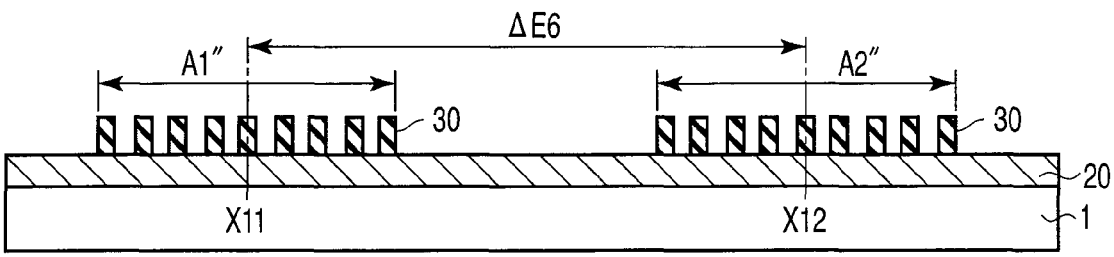
F I G. 11C

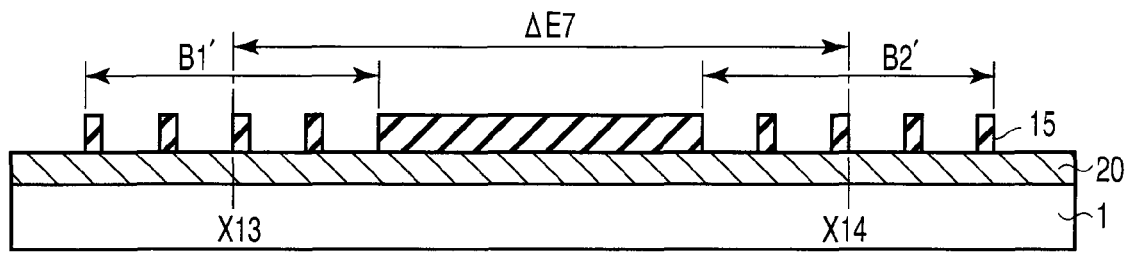
F I G. 12 A
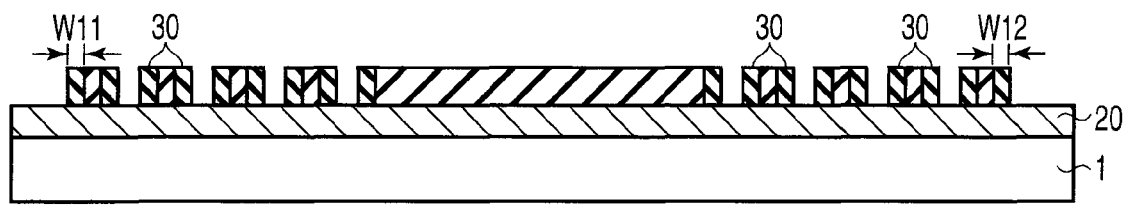
F I G. 12 B
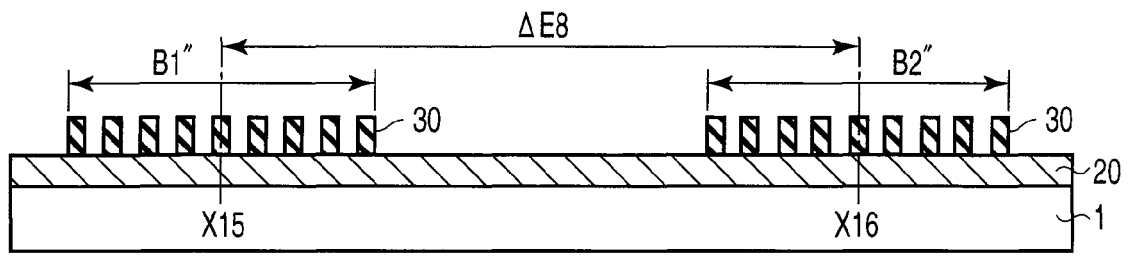
F I G. 12 C
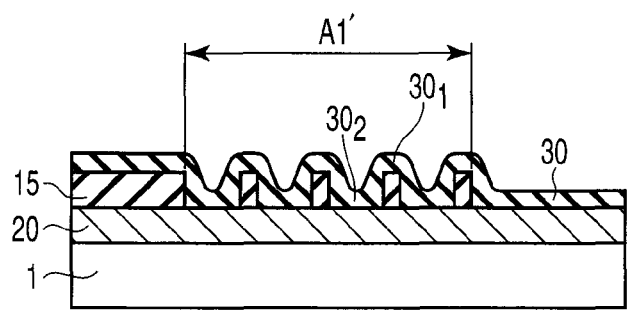
F I G. 13

|  | Dummy pattern material | Sidewall material |
|---|---|---|
| Example 1 | BSG | TEOS |
| Example 2 | Amorphous silicon | Silicon nitride |
| Example 3 | Amorphous silicon | TEOS |
| Example 4 | TEOS | Amorphous silicon |
| Example 5 | Amorphous silicon | Amorphous silicon |

F I G. 1 4

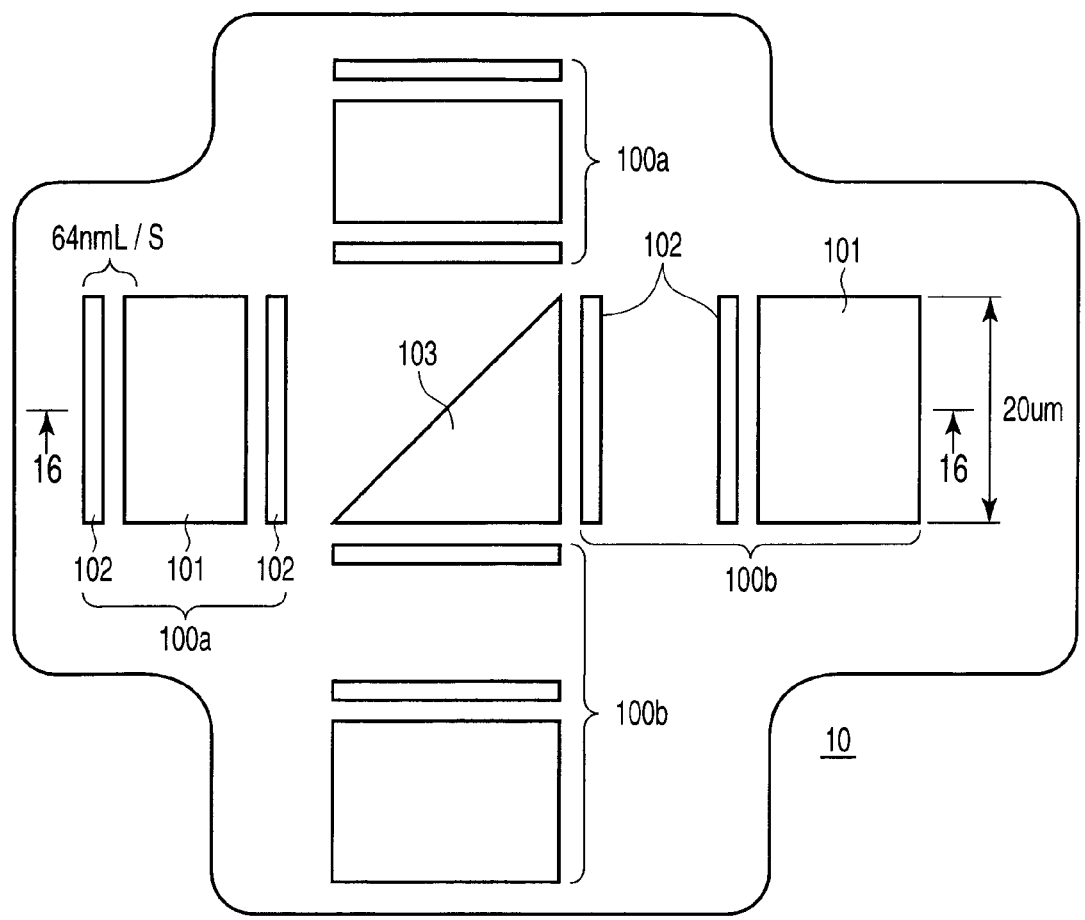
F I G. 15
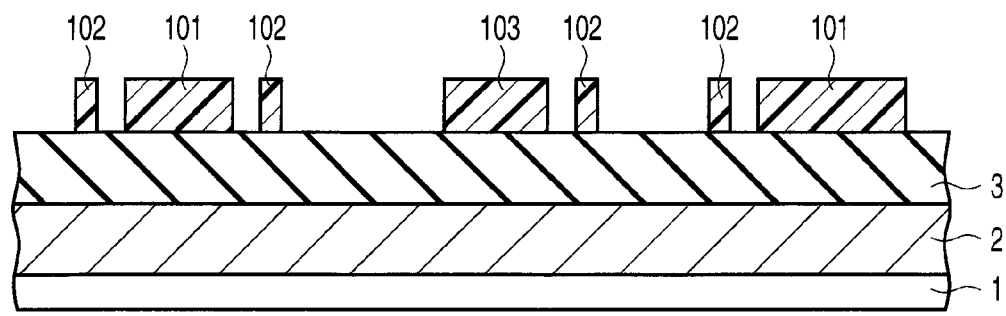
F I G. 16

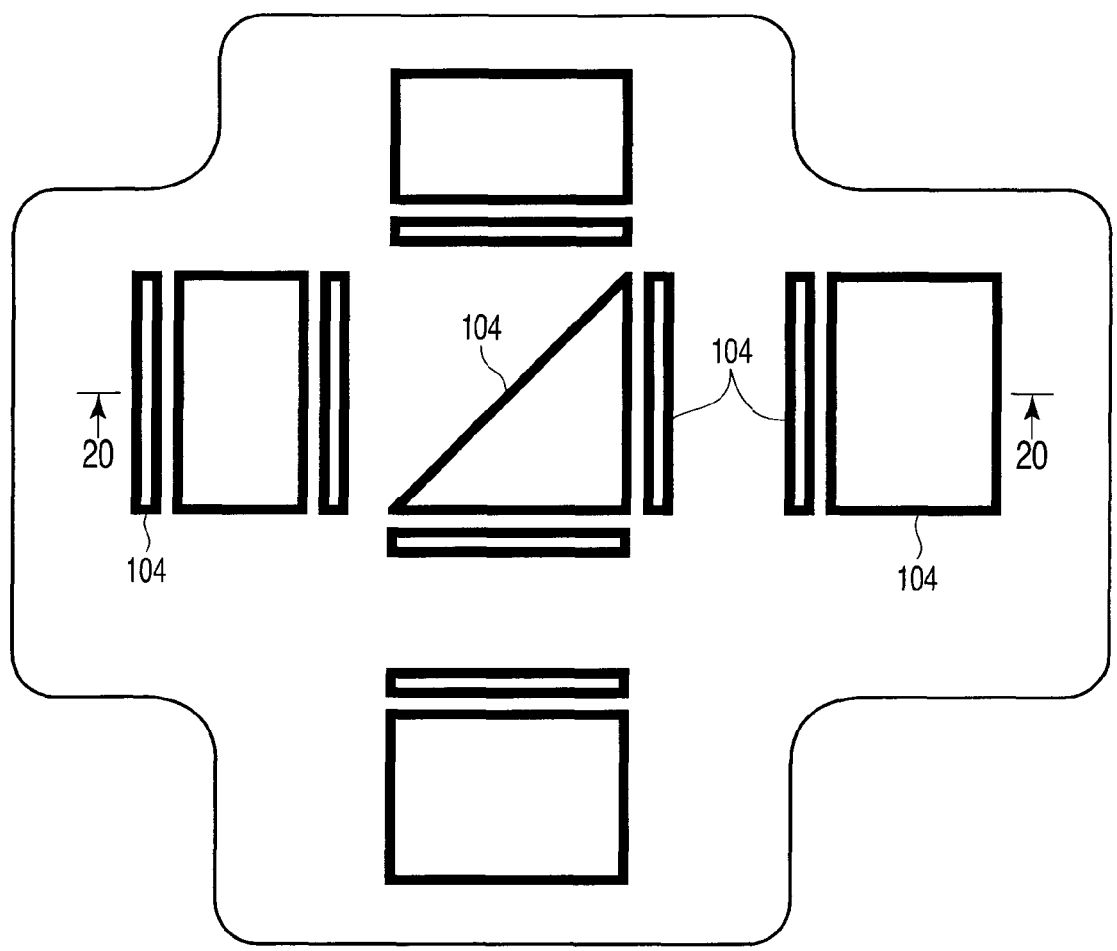
F I G. 19
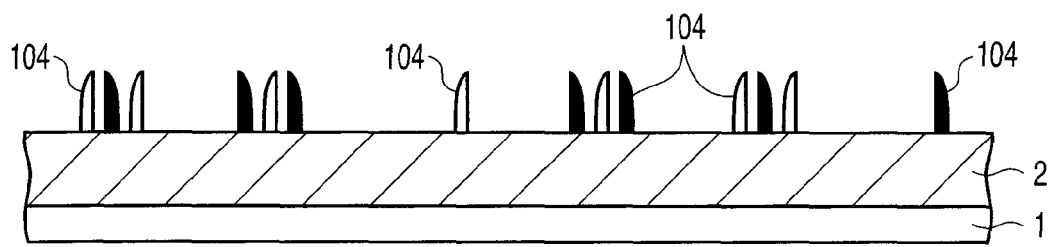
F I G. 20

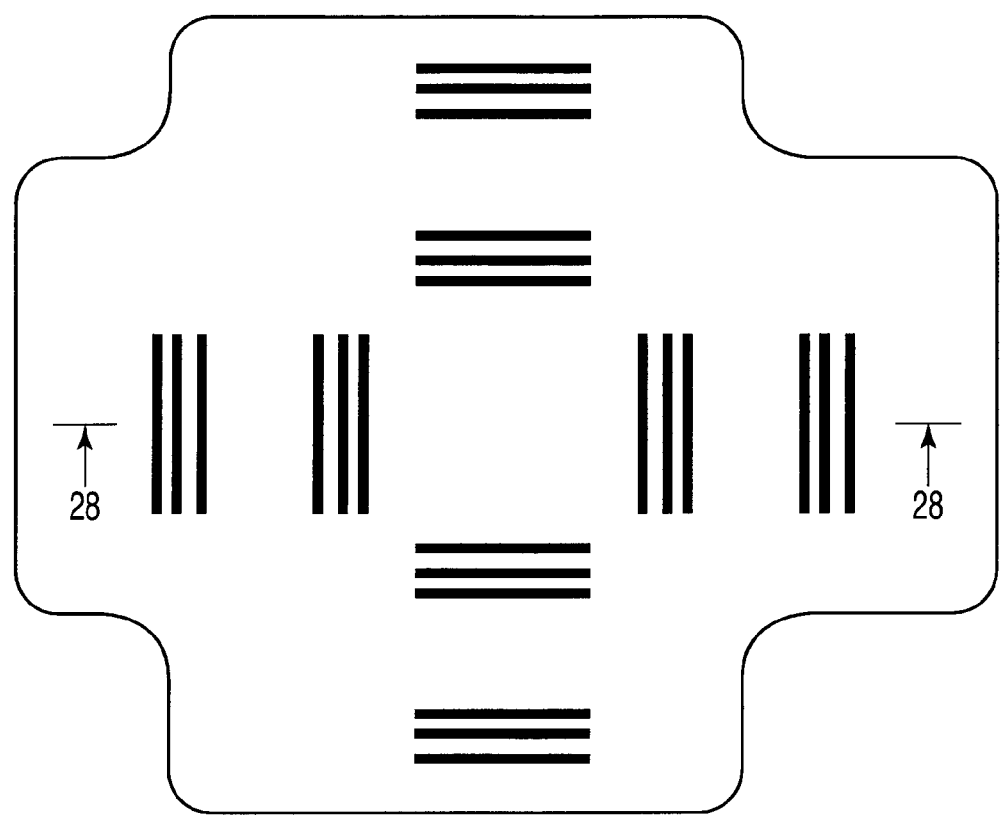
F I G. 27
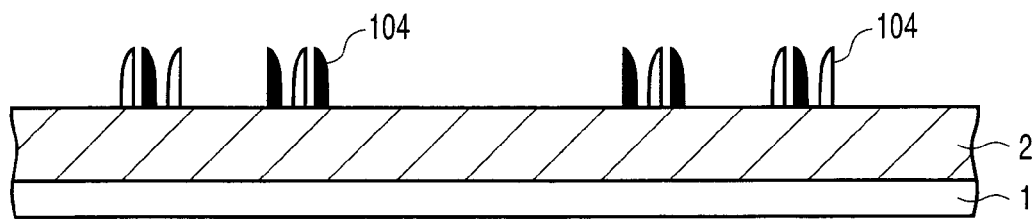
F I G. 28
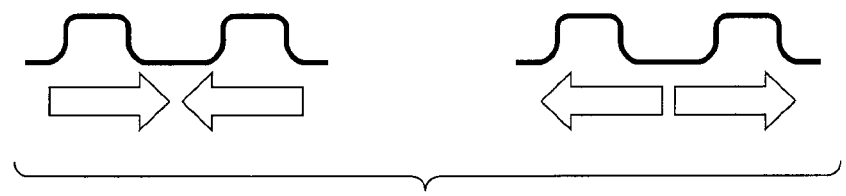
F I G. 29

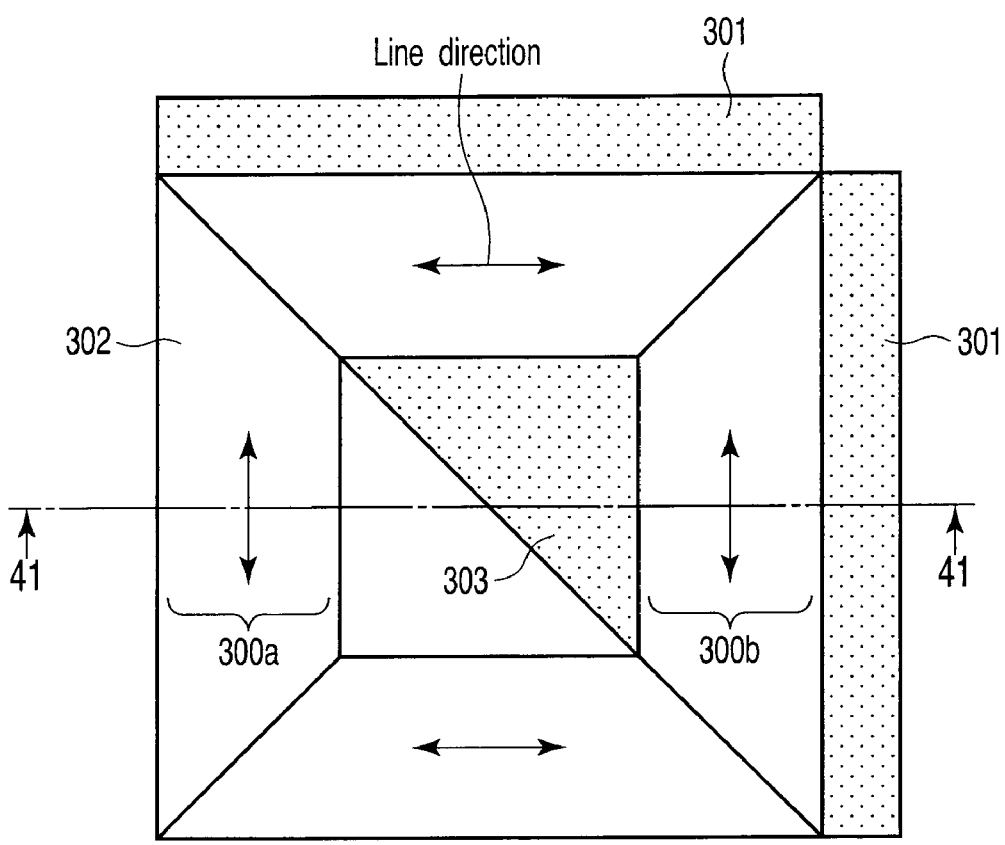
F I G. 4 0
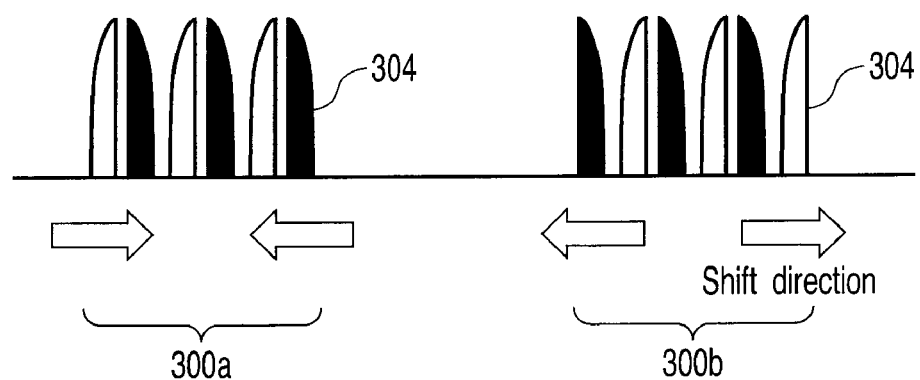
F I G. 4 1

US 8,072,601 B2

PATTERN MONITOR MARK AND MONITORING METHOD SUITABLE FOR MICROPATTERN

CROSS-REFERENCE TO RELATED APPLICATIONS

This application is based upon and claims the benefit of priority from prior Japanese Patent Applications No. 2007-050436, filed Feb. 28, 2007; and No. 2007-075480, filed Mar. 22, 2007, the entire contents of both of which are incorporated herein by reference.

BACKGROUND OF THE INVENTION

1. Field of the Invention

The present invention relates to a method of forming a monitor mark suitable for a micropattern and a monitoring method using the monitor mark.

2. Description of the Related Art

The miniaturization of semiconductor devices is greatly dependent on lithographic technology. Therefore, it is generally difficult to form a line-and-space pattern having a micro width exceeding a lithographic resolution limit. In view of such a problem, a method known as a double patterning technology using a spacer process has been proposed as a method of forming a micropattern exceeding the resolution limit (e.g., refer to Jpn. Pat. Appln. KOKAI Publication No. 2002-280338, and Jpn. Pat. Appln. KOKAI Publication No. 2006-303022). This technology features to firstly forms a double pitched pattern compared to the final product pattern, and to secondly reduce the pitch to half using means other than exposure.

In this technology, a dummy pattern is formed by lithography using, for example, a resist on an interconnect layer, and after the formation of an insulating film covering this dummy pattern, anisotropic etching such as RIE is carried out. Thus, a sidewall insulator remains on the sidewall of the dummy pattern, and then the dummy pattern is removed. The interconnect layer is etched using the remaining sidewall insulator as a mask, such that a micro interconnect pattern is formed.

In the pattern forming process using sidewall spacers, the pitch of interconnect lines is shifted due to a dimensional error after exposure or processing or due to an error in the thickness of a sidewall, and this results in a misalignment error. Therefore, in the pattern forming process using sidewall spacers, it is necessary to highly precisely measure and manage not only misalignment caused by an alignment error in an exposure device but also a pattern transfer displacement (pitch shift) error caused by the dimensional error, and control the process on the basis of the result of the measurement.

Although the micropattern can be formed by the above-mentioned method, a phenomenon occurs where the dimensions of the formed line-and-space patterns alternately vary due to, for example, a dimensional error in the resist patterns or variations in the etching rate of an underlying interconnect layer dependent on the shape of the sidewall insulator as a mask.

There is a need to readily measure the effect of such an error in a short time, and feed back the result of the measurement to a process in order to improve the quality of the pattern forming process using sidewall spacers. To this end, a scanning electron microscope (SEM) can be used to inspect the patterns, but measurement with the SEM generally takes much time and is therefore not suitable for the collection of information on a large number of points in a substrate.

Thus, there is a desire for the provision of a method of more easily measuring and evaluating a dimensional error attributed to a problem in the pattern forming process using sidewall spacers than in the case of using the SEM, and the provision of a monitor mark therefor and a semiconductor device manufacturing method using the monitor mark.

BRIEF SUMMARY OF THE INVENTION

According to one aspect of the invention, there is provided a method of forming a monitor mark, which includes:

forming an insulating film on a semiconductor substrate; and forming a first repetitive line pattern group and a second repetitive line pattern group by patterning the insulating film on the semiconductor substrate, such that the first repetitive line pattern group and the second repetitive line pattern group face each other with a predetermined space therebetween.

BRIEF DESCRIPTION OF THE SEVERAL VIEWS OF THE DRAWING

FIG. 6 is a sectional view of a process monitor mark B along a dotted line in FIG. 4;

FIG. 7 is a sectional view showing the measurement of an intercentral distance ΔE1 between line-and-space patterns A1 and A2 in the process monitor mark A;

FIG. 8 is a sectional view showing the measurement of an intercentral distance ΔE3 between line-and-space patterns B1 and B2 in the process monitor mark B;

FIG. 9 is a sectional view showing the process monitor mark A after slimming, and the measurement of an intercentral distance ΔE2 between the line-and-space patterns A1 and A2;

FIG. 10 is a sectional view showing the process monitor mark B after slimming, and the measurement of an intercentral distance ΔE4 between the line-and-space patterns B1 and B2;

FIG. 11A is a sectional view of dummy patterns A1' and A2';

FIG. 11B is a sectional view in which sidewall patterns are formed on the sidewalls of the dummy patterns A1' and A2';

FIG. 11C is a sectional view of sidewall patterns A1" and A2";

FIG. 12A is a sectional view of dummy patterns B1' and B2';

FIG. 12B is a sectional view in which sidewall patterns are formed on the sidewalls of the dummy patterns B1' and B2';

FIG. 12C is a sectional view of sidewall patterns B1" and B2";

FIG. 13 is a sectional view showing how a sidewall material is conformally formed on the dummy pattern A1';

FIG. 14 is a table showing examples of the combination of the dummy pattern and the material of the sidewall;

FIG. 15 is a top view of an evaluation mark according to a third embodiment;

FIG. 16 is a sectional view of a semiconductor device substrate in the case where the evaluation mark in FIG. 15 is applied to the resist patterns in a substrate for forming a film to be processed, and corresponds to a section along line 16-16 in FIG. 15;

FIG. 19 is a top view of the substrate after the underlying layer in FIG. 17 has been removed;

FIG. 20 is a sectional view along line 20-20 in FIG. 19;

FIG. 27 is a top view of sidewall patterns in the case where space alternately changes;

FIG. 28 is a sectional view along line 28-28 in FIG. 27;

FIG. 29 is a profile of the inspection image along line 28-28 in FIG. 27;

FIG. 40 is a top view of an evaluation pattern according to a sixth embodiment;

FIG. 41 is a sectional view showing the shift direction of a group of sidewall micropatterns on line 41-41 in FIG. 40;

DETAILED DESCRIPTION OF THE INVENTION

Figure 1A:
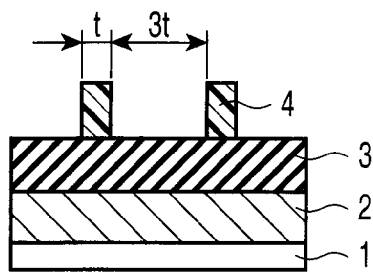
FIGS. 1A to 1E are diagrams showing stepwise a method of forming line-and-space patterns by a general pattern forming process using sidewall spacers.
Figure 2A:
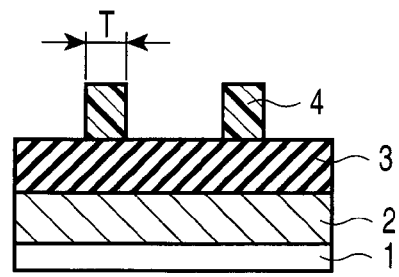
FIGS. 2A to 2E are diagrams explaining, in the order of process steps, the cause of alternate space changes in the case where a dimensional error is produced in the resist patterns in FIG. 1B.

Before describing embodiments of the present invention, the mechanism of the production of variations in a line-and-space dimension in a pattern forming process using sidewall spacers is described. In the case of a line-and-space pattern, a film to be processed is generally etched using a resist pattern, and the dimensions of the pattern change in accordance with a dose during the exposure of a resist. Factors for the dimensional variation are also included when mask dimensions are reduced using slimming technology. The dimensions also vary depending on the amount (time) of etching. In such a case, if there is a method of readily inspecting the dimensional variation, the result can be rapidly fed back to a process condition, which permits manufacture to be achieved with a high yield.

FIGS. 1A to 1E and 2A to 2E are diagrams schematically showing a general pattern forming process using sidewall spacers and the mechanism of variations produced in dimensions. In the drawings, 1 denotes a semiconductor substrate, 2 denotes an interconnect layer, 3 denotes an insulating film, and 4 denotes a resist pattern. When a line-and-space pattern with an equal space t is manufactured, the width of the resist pattern 4 is t, and the space between the resist patterns 4 is 3t, and the process of this manufacture is shown in FIGS. 1A to 1E. FIGS. 2A to 2E show a case where the width of the resist pattern 4 has changed to T in the same process.

Figure 1B:
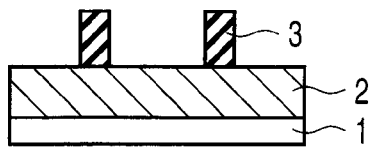
Figure 2B:
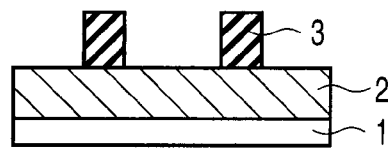
Figure 1C:
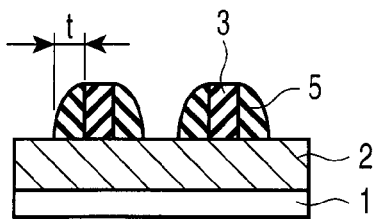
Figure 2C:
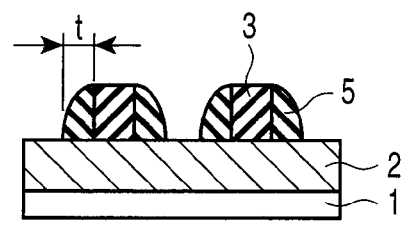

FIGS. 1B and 2B show the result of the anisotropic etching of the insulating film 3 using the resist pattern 4 by, for example, reactive ion etching (RIE). A pattern obtained here is coated with an insulating film (not shown) and subjected to the RIE to obtain a sidewall insulator 5. Conditions are adjusted so that the width of the surface of this sidewall insulator contacting the interconnect layer 2 may be t (FIGS. 1C and 2C).

Figure 1D:
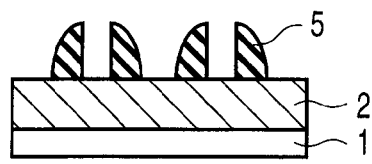
Figure 2D:
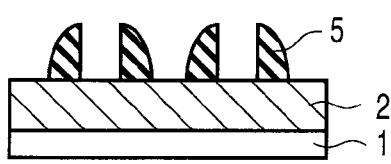
Figure 1E:
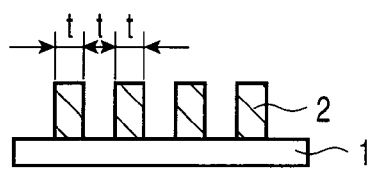
Figure 2E:
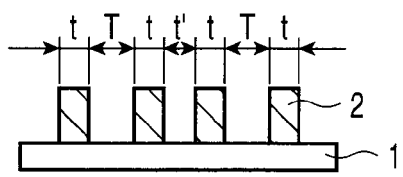

Then, when the insulating film 3 has been removed, the sidewall insulator 5 alone remains as in FIGS. 1D and 2D. When the interconnect layer 2 is subjected to the RIE using this sidewall insulator 5, an interconnect pattern with a line-and-space pattern dimension of t can be obtained in FIG. 1E. On the other hand, a line dimension is t in FIG. 2E, but the space dimension alternates between T and t' (<T).

In a pattern evaluation method of the present invention, the above-mentioned dimensional change can be readily detected. The embodiments of the present invention will hereinafter be described with reference to the drawings. In addition, the drawings are schematic, and the relation between thickness and planar dimension, the ratio of the thicknesses of layers, etc. are different from real ones. Therefore, specific thickness and dimensions should be judged in consideration of the following description. It should also be understood that there are contained parts different from each other in dimensions and ratios among the drawings.

First Embodiment

A process monitoring method according to a first embodiment will be described with FIGS. 3 to 11. Described below is an example of the process monitoring method using a process monitor mark which is a resist pattern formed on a region where no semiconductor circuit is formed.

Figure 3:
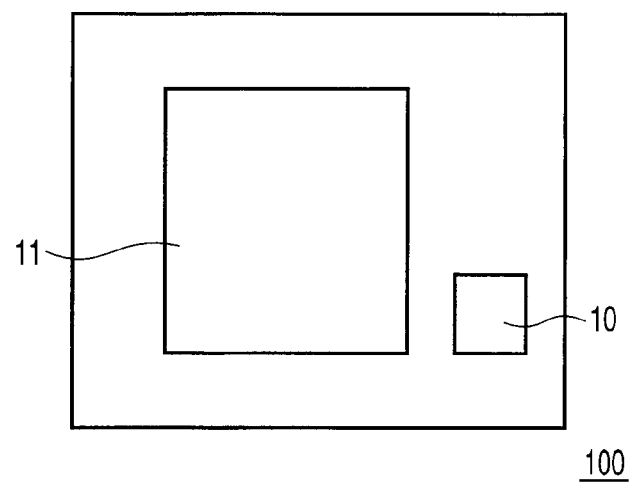
FIG. 3 is a plan view showing the position of a process monitor mark on a semiconductor chip according to a first embodiment.

As shown in FIG. 3, there is a region where a semiconductor circuit 11 is formed in an exposure field on a semiconductor chip 100, and in the present embodiment, a process monitor mark 10 as a resist pattern is formed in a part different from the region where the semiconductor circuit 11 is formed.

The process monitor mark 10 is formed by exposing and developing an insulating film based on an oxide film made of, for example, boron-doped silicon oxide (BSG) or tetraethoxysilane (TEOS), or a resist film formed on a base material made of, for example, amorphous silicon. These base materials are, for example, dummy pattern materials (mask materials) with which a dummy pattern is formed in the pattern forming process using sidewall spacers described in detail in the following second embodiment. The semiconductor circuit 11 indicates a region where a semiconductor circuit is finally formed, and no semiconductor circuit has been formed yet in the present embodiment.

Figure 4:
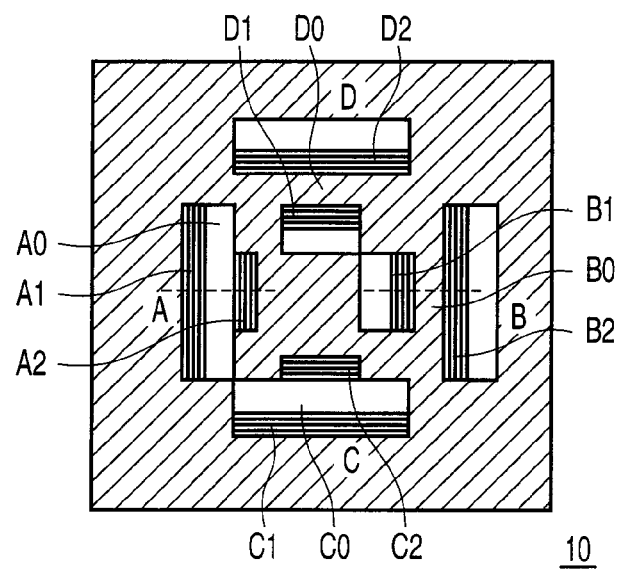
FIG. 4 is a plan view showing the configuration of the process monitor mark according to the first embodiment.

The process monitor mark 10 has a planar shape, for example, as shown in FIG. 4, and is composed of four process monitor marks A, B, C, D.

Figure 5:
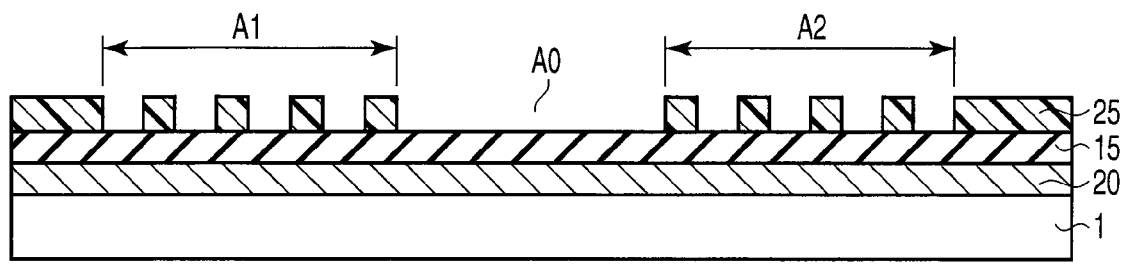
FIG. 5 is a sectional view of a process monitor mark A along a dotted line in FIG. 4.

The process monitor marks A and C are similar marks. FIG. 5 is a sectional view of the process monitor mark A along a dotted line in FIG. 4. The process monitor mark C is also a pattern formed by a resist film 25 with the same configuration as that of the process monitor mark A. For example, the process monitor mark A is a resist pattern in which a pair of line-and-space pattern regions A1 and A2 with a pitch double the pitch of interconnect lines to be formed in the semiconductor circuit 11 is arranged across a space pattern region A0 (white part), as shown in FIG. 5.

The width of the space pattern region A0 has only to be equal to or more than a width at which this region can be measured as a separator of the line-and-space pattern regions A1 and A2 by the optical misalignment inspection apparatus as described later, and this width is desirably, for example, about 5 to 6 μm.

The process monitor marks B and D are similar marks. FIG. 6 is a sectional view of the process monitor mark B along a dotted line in FIG. 4. The process monitor mark D is also a resist pattern with the same configuration as that of the process monitor mark B. For example, the process monitor mark B is a resist pattern in which a pair of line-and-space pattern regions B1 and B2 with a pitch double the pitch of interconnect lines to be formed in the semiconductor circuit 601 is arranged across a solid pattern region B0 (wide pattern part), as shown in FIG. 6.

The width of the solid pattern region B0 has only to be equal to or more than a width at which this region can be measured as a separator of the line-and-space pattern regions B1 and B2 by the optical misalignment inspection apparatus as described later, and this width is desirably, for example, about 5 to 6 μm.

Next, the intercentral distance between the line-and-space pattern regions provided in each of the process monitor marks A, B, C, D is measured. Specifically, in the case of, for example, the process monitor mark A, the central position X1 of the line-and-space pattern region A1 and the central position X2 of the line-and-space pattern region A2 are measured, as shown in FIG. 7. Here, X1 and X2 which are coordinates of the central positions are valued so that the direction to the right side of the drawing is set positive. This holds true with the following cases.

When the optical misalignment inspection apparatus is used, the pattern as such can not be recognized because the pattern periods of the line-and-space pattern regions A1 and A2 are equal to or less than the resolution of the optical misalignment inspection apparatus. However, a light intensity profile corresponding to the opening area ratio of the pattern can be obtained, so that each of the regions A1 and A2 can be recognized as a mark intervening the space pattern region A0. Therefore, the central positions X1 and X2 can be measured, and an intercentral distance $\Delta E1=X2-X1$ which is the difference between X1 and X2 can be measured.

In the case of the process monitor mark C as well, the intercentral distance between line-and-space pattern regions C1 and C2 can be measured.

Furthermore, in the case of the process monitor mark B, the central position X5 of the line-and-space pattern region B1 and the central position X6 of the line-and-space pattern region B2 are measured in the same manner, as shown in FIG. 40.

When the optical misalignment inspection apparatus is used, the pattern as such can not be recognized because the pattern periods of the line-and-space pattern regions B1 and B2 are equal to or less than the resolution of the optical misalignment inspection apparatus. However, a light intensity profile corresponding to the opening area ratio of the pattern can be obtained, so that each of the regions B1 and B2 can be recognized as a mark intervening the solid pattern region B0. Therefore, the central positions X5 and X6 can be measured, and an intercentral distance $\Delta E3=X6-X5$ which is the difference between X5 and X6 can be measured.

In the case of the process monitor mark D as well, the intercentral distance between line-and-space pattern regions D1 and D2 can be measured.

Next, slimming is carried out using normal slimming technology in such a manner as to reduce the line width of all the resist patterns on the semiconductor chip 100 including the line-and-space pattern regions A1, A2, B1, B2, C1, C2, D1 and D2.

Specifically, the line widths W1 and W2 of the line-and-space pattern regions A1 and A2 shown in FIG. 7 are reduced by the slimming to W3 and W4 as shown in FIG. 9. The same holds true with the line-and-space pattern regions C1 and C2. Moreover, the line widths W5 and W6 of the line-and-space pattern regions B1 and B2 shown in FIG. 8 are reduced to W7 and W8 as shown in FIG. 10. The same holds true with the line-and-space pattern regions D1 and D2.

In this slimming step, depending on a desired process condition, the line patterns of the line-and-space pattern regions A1, A2, B1, B2, C1, C2, D1 and D2 are slimmed simultaneously with the slimming of the line pattern of the resist for forming an interconnect pattern in the semiconductor circuit 11. Thus, the line-and-space pattern regions A1, A2, B1, B2, C1, C2, D1 and D2 function as process monitor marks directed to a resist line pattern for the interconnect pattern to be formed in the semiconductor circuit 11.

Then, after the slimming process, the intercentral distance between the line-and-space pattern regions A1 and A2, the intercentral distance between the line-and-space pattern regions C1 and C2, the intercentral distance between the line-and-space pattern regions B1 and B2, and the intercentral distance between the line-and-space pattern regions D1 and D2 are measured again.

Specifically, in the case of the process monitor mark A, central positions X3 and X4 shifted by the slimming of the line-and-space pattern regions A1 and A2 as shown in FIG. 9 are again measured using the optical misalignment inspection apparatus, and an intercentral distance $\Delta E2=X4-X3$ is measured.

The difference between the central positions X3 and X4 shifted by the slimming and the central positions X1 and X2 before the slimming can be expressed by X1−X3=(W1−W3)/2, X4−X2=(W2−W4)/2, as apparent from the comparison between FIGS. 7 and 9. Therefore, the shift amount (ΔE2−ΔE1) of the intercentral distance can be expressed by use of $$\Delta E2 - \Delta E1 = (X4 - X2) + (X1 - X3) \quad (1)$$
$$= (W2 - W4)/2 + (W1 - W3)/2$$

and by use of dimensional variations (W2−W4) and (W1−W3) of the line pattern produced by the slimming. This is the case where the intercentral distance increases by the slimming of the resist.

The dimensional variations (W2−W4) and (W1−W3) generally should have the same value, but the variation of the intercentral distance is measured as an average value of the dimensional variations as apparent from Equation 1 even if the dimensional variations have values slightly different from each other due to a measurement error or a slimming error. Therefore, even if such an error is caused, the measurement of the variation of the intercentral distance enables the accurate calculation of the dimensional variation of the line pattern produced by the slimming.

When wafers are sequentially processed, the dimensional variation of the line pattern calculated here is compared with a desired dimensional variation such that the amount of slimming can be controlled to produce the desired dimensional variation for the subsequently processed wafers. Alternatively, a process condition may be changed to be closer to the desired dimensional variation for the subsequently processed wafers, and this control may be repeated wafer by wafer such that slimming can be finally achieved with the desired dimensional variation.

Furthermore, the dimensional variation of the line pattern by the slimming can also be calculated in the same manner as described above for the process monitor mark C, so that this dimensional variation and the dimensional variation obtained using the process monitor mark A can be used to calculate an average dimensional variation with higher accuracy. It goes without saying that this result can be used to enable more precise control of the slimming amount.

In the case of the process monitor mark B, central positions X7 and X8 shifted by the slimming of the line-and-space pattern regions B1 and B2 as shown in FIG. 10 are again measured using the optical misalignment inspection apparatus, and an intercentral distance ΔE4=X8−X7 is measured.

The difference between the central positions X7 and X8 shifted by the slimming and the central positions X5 and X6 before the slimming can be expressed by X7−X5=(W5−W7)/2, X6−X8=(W6−W8)/2, as apparent from the comparison between FIGS. 8 and 10. Therefore, the shift amount (ΔE4−ΔE3) of the intercentral distance can be expressed by use of $$\Delta E4 - \Delta E3 = -(X6 - X8) - (X7 - X5) \quad (2)$$
$$= -(W6 - W8)/2 - (W5 - W7)/2$$

and by use of dimensional variations (W6−W8) and (W5−W7) of the line pattern produced by the slimming. This is the case where the intercentral distance decreases by the slimming of the resist.

The dimensional variations (W6−W8) and (W5−W7) generally should have the same value, but the variation of the intercentral distance is measured as an average value of the dimensional variations as apparent from Equation 2 even if the dimensional variations have values slightly different from each other due to a measurement error or a slimming error. Therefore, even if such an error is caused, the measurement of the variation of the intercentral distance enables the accurate calculation of the dimensional variation of the line pattern produced by the slimming.

When wafers are sequentially processed, the dimensional variation of the line pattern calculated here is compared with a desired dimensional variation such that the amount of slimming can be controlled to produce the desired dimensional variation for the subsequently processed wafers. Alternatively, a process condition may be changed to be closer to the desired dimensional variation for the subsequently processed wafers, and this control may be repeated wafer by wafer such that slimming can be finally achieved with the desired dimensional variation.

Furthermore, the dimensional variation of the line pattern by the slimming can also be calculated in the same manner as described above for the process monitor mark D, so that this dimensional variation and the dimensional variation obtained using the process monitor mark B can be used to calculate an average dimensional variation with higher accuracy. It goes without saying that this result can be used to enable more precise control of the slimming amount.

Moreover, estimates of the slimming dimensional variations obtained by use of the process monitor marks A, B, C, D as described above may be properly combined with each other and averaged to achieve more precise control of the slimming amount.

For example, when the slimming amount of the resist is anisotropic, the dimensional variations obtained by use of the process monitor marks A and B are averaged to measure the slimming amount for the horizontal direction in FIG. 4, and the dimensional variations obtained by use of the process monitor marks C and D are averaged to measure the slimming amount for the vertical direction in FIG. 4, such that different control of the slimming amount can be precisely achieved for each of the directions.

In addition, the central positions and intercentral distance of the line-and-space patterns can be rapidly measured using the optical misalignment inspection apparatus in the present embodiment, but the apparatus is not limited to this and a scanning electron microscope may be used instead.

As described above, in the process monitoring method of the present embodiment, the slimming amount can be accurately measured by measuring the change of the central position due to the slimming of the resist pattern in the line-and-space region, so that highly precise process control can be achieved for the slimming amount on the basis of the result of the measurement.

Second Embodiment

A process monitoring method according to a second embodiment is explained with the accompanied drawings. An example of the process monitoring method is described below wherein process monitor marks formed in places different from the region where a semiconductor circuit is formed are used in a sidewall spacer process.

First, an underlying dummy pattern material 15 is processed by etching with masks of the resist patterns in FIGS. 9 and 10 formed in the seventh embodiment by slimming the resist patterns of the process monitor marks A and B in FIG. 3.

The dummy pattern material 15 is, for example, BSG, TEOS or amorphous silicon. This is etched to form line-and-space pattern regions A1' and A2' of a dummy pattern shown in FIG. 11A and line-and-space pattern regions B1' and B2' of a dummy pattern shown in FIG. 12A.

The line width in the dummy pattern regions A11 and A2' as well as B1' and B2' is smaller than that in the line-and-space pattern regions A1 and A2 as well as B1 and B2 of the resist patterns, but the pitch of the line-and-space patterns in the dummy pattern regions is double the pitch of interconnect lines to be formed in the semiconductor circuit 11 as in the line-and-space pattern regions. In addition, a base material 20 of the dummy pattern is, for example, interconnect or electrode material.

In the same manner, line-and-space pattern regions C1' and C2' as well as D1' and D2' of the dummy patterns are simultaneously formed with masks of the patterns formed by slimming the resist patterns of the process monitor marks C and D in the above-mentioned etching (not shown).

Furthermore, as shown in FIG. 11A, the central position X9 of the line-and-space pattern region A1' of the dummy pattern and the central position X10 of the line-and-space pattern region A2' are measured.

When the optical misalignment inspection apparatus is used, the pattern as such can not be recognized because the pattern periods of the line-and-space pattern regions A1' and A2' are equal to or less than the resolution of the optical misalignment inspection apparatus. However, a light intensity profile corresponding to the opening area ratio of the pattern can be obtained, so that these regions can be recognized as marks. Moreover, the central positions X9 and X10 can be measured because the line-and-space pattern regions A1' and A2' are about 5 to 6 μm off from each other and can thus be separately recognized. As a result, an intercentral distance ΔE5=X10−X9 which is the difference between X9 and X10 can be measured. The intercentral distance between the line-and-space dummy patterns C1' and C2' (not shown) can be measured in a similar manner.

Furthermore, as shown in FIG. 12A, the central position X13 of the line-and-space pattern region B1' and the central position X14 of the line-and-space pattern region B2' are measured.

In this case as well, the central positions X13 and X14 of the line-and-space pattern regions B1' and B2' can be measured using the optical misalignment inspection apparatus because these regions are about 5 to 6 μm off from each other and can thus be separately recognized. As a result, and an intercentral distance ΔE7=X14−X13 which is the difference between X13 and X14 can be measured. The intercentral distance between the line-and-space dummy patterns D1' and D2' (not shown) can be measured in a similar manner.

Next, a sidewall material 30 is conformally formed by, for example, CVD on the entire top surfaces of the dummy pattern regions A1' and A2' formed on the base material 20 in FIG. 11A, the entire top surfaces of the dummy pattern regions B1' and B2' formed on the base material 20 in FIG. 12A, and the entire top surfaces of the unshown dummy pattern regions C1' and C2' as well as D1' and D2'.

The sidewall material 30 is, for example, TEOS, a silicon nitride film or amorphous silicon. The state of the sidewall material 30 on the dummy pattern at this point in the case of, for example, the dummy pattern region A1' is as shown in FIG. 13. In addition, possible combinations of the dummy pattern material 15 and the sidewall material 30 are as shown in FIG. 13.

Then, the sidewall material 30 formed on the dummy pattern regions A1', A2', B1', B2', C1', C2', D1' and D2', that is, a sidewall material (top) 301 shown in FIG. 13, and the sidewall material 630 formed on the base material 20 of the dummy pattern, that is, a sidewall material (bottom) 302 shown in FIG. 13 are removed by reactive ion etching (RIE). Thus, as shown in FIGS. 11B and 12B, the sidewall material 30 remains on the sidewalls of the dummy patterns A1' and A2' as well as B1' and B2' alone. At the same time, the sidewall material 30 also remains on the sidewalls of the dummy patterns C1', C2', D1' and D2' (not shown).

Finally, all the dummy pattern regions A1', A2', B1', B2', C1', C2', D1' and D2' are removed by wet etching using, for example, a hydrofluoric acid (HF) based wet etching solution. Thus, sidewall pattern regions A1", A2" as well as B1", B2" are formed, from FIG. 11B to FIG. 11C and from FIG. 12B to FIG. 12C. At the same time, sidewall pattern regions C1", C2", D1" and D2" are also formed in the case of the dummy pattern regions C1', C2', D1' and D2' (not shown).

This is the procedure of forming, in accordance with the pattern forming process using sidewall spacers, the sidewall pattern regions A1", A2", B1", B2", C1", C2", D1" and D2" from the dummy pattern regions A1', A2', B1', B2', C1', C2', D1' and D2' formed by the double-pitched lines exposure.

At the same time, the pattern forming process using sidewall spacers is also carried out in the semiconductor circuit 11 in FIG. 3. Thus, the dummy pattern regions A11, A2', B1', B2', C1', C2', D1' and D2' and the sidewall pattern regions A1", A2", B1", B2", C1", C2", D1" and D2" function as process monitor marks for the interconnect patterns to be formed in the semiconductor circuit 11.

Then, the intercentral distance between the line-and-space pattern regions A1" and A2", the intercentral distance between the line-and-space pattern regions C1" and C2", the intercentral distance between the line-and-space pattern regions B1" and B2", and the intercentral distance between the line-and-space pattern regions D1" and D2" are measured.

In the case of the line-and-space pattern regions A1" and A2", central positions X1 and X12 shifted by the pattern forming process using sidewall spacers as shown in FIG. 11C are again measured using the optical misalignment inspection apparatus, and an intercentral distance ΔE6=X12−X11 is measured.

The difference between the central positions X11 and X12 shifted by the pattern forming process using sidewall spacers and the central positions X9 and X10 of the dummy pattern regions A1' and A2' can be expressed by X11−X9=W9/2, X10−X12=W10/2, as apparent from the comparison between FIGS. 11A and 11C. Here, W9 and W10 are the line widths of the sidewall patterns A1" and A2". Therefore, the variation (ΔE6−ΔE5) of the intercentral distance can be expressed by use of $$\Delta E6 - \Delta E5 = -(X11 - X9) - (X10 - X12) \quad (3)$$
$$= -(W9 + W10)/2$$

and by use of W9 and W10 which are the line widths of the sidewall patterns formed by the pattern forming process using sidewall spacers. This is the case where the intercentral distance decreases by the pattern forming process using sidewall spacers.

The line widths W9 and W10 of the sidewall pattern regions A1" and A2" generally should have the same value, but the variation of the intercentral distance is measured as an average value of the line widths as apparent from Equation 3 even if the line widths have values slightly different from each other due to a measurement error or a process error. Therefore, even if such an error is caused, the measurement of the variation of the intercentral distance enables the accurate calculation of the line widths of the sidewall pattern regions A1" and A2" formed by the pattern forming process using sidewall spacers.

When wafers are sequentially processed, the line widths of the sidewall patterns calculated here are compared with a desired line width such that the sidewall pattern manufacturing process (the formation of the sidewall material, RIE, etc.) can be controlled to produce the desired line width for the subsequently processed wafers. Alternatively, the process condition may be changed to be closer to the desired line width for the subsequently processed wafers, and this control may be repeated wafer by wafer such that the sidewall patterns with the desired line width can be finally formed.

Furthermore, the line width in the sidewall pattern regions C1" and C2" can also be calculated in the same manner as described above, so that this line width and the line width obtained from the sidewall pattern regions A1" and A2" can be used to calculate an average line width with higher accuracy. It goes without saying that this result can be used to enable more precise control of the line width of the sidewall pattern.

In the case of the line-and-space pattern regions B1" and B2", central positions X15 and X16 shifted by the pattern forming process using sidewall spacers as shown in FIG. 12C are again measured using the optical misalignment inspection apparatus, and an intercentral distance ΔE8=X16−X15 is measured.

The difference between the central positions X15 and X16 shifted by the pattern forming process using sidewall spacers and the central positions X13 and X14 of the dummy pattern regions B1' and B2' can be expressed by X13−X15=W11/2, X16−X14=W12/2, as apparent from the comparison between FIGS. 12A and 12C. Here, W11 and W12 are the line widths of the sidewall patterns B1" and B2". Therefore, the variation (ΔE8-ΔE7) of the intercentral distance can be expressed by use of $$\Delta E8 - \Delta E7 = -(X13 - X15) - (X16 - X14) \quad (4)$$
$$= -(W11 + W12)/2$$

and by use of W11 and W12 which are the line widths of the sidewall patterns formed by the pattern forming process using sidewall spacers. This is the case where the intercentral distance increases by the pattern forming process using sidewall spacers.

The line widths W11 and W12 of the sidewall pattern regions B1" and B2" generally should have the same value, but the variation of the intercentral distance is measured as an average value of the line widths as apparent from Equation 4 even if the line widths have values slightly different from each other due to a measurement error or a process error. Therefore, even if such an error is caused, the measurement of the variation of the intercentral distance enables the accurate calculation of the line widths of the sidewall pattern regions B1" and B2" formed by the pattern forming process using sidewall spacers.

When wafers are sequentially processed, the line widths of the sidewall patterns calculated here are compared with a desired line width such that the sidewall pattern manufacturing process (the formation of the sidewall material, RIE, etc.) can be controlled to produce the desired line width for the subsequently processed wafers. Alternatively, the process condition may be changed to be closer to the desired line width for the subsequently processed wafers, and this control may be repeated wafer by wafer such that the sidewall patterns with the desired line width can be finally formed.

Furthermore, the line width in the sidewall pattern regions D1" and D2" can also be calculated in the same manner as described above, so that this line width and the line width obtained from the sidewall pattern regions B1" and B2" can be used to calculate an average line width with higher accuracy. It goes without saying that this result can be used to enable more precise control of the line width of the sidewall pattern.

Moreover, estimates of the line widths of the sidewall patterns obtained by use of the dummy pattern regions A1', A2', B1', B2', C1', C2', D1' and D2' and the sidewall pattern regions A1", A2", B1", B2", C1", C2", D1" and D2" as described above may be properly combined with each other and averaged to achieve more precise control of the slimming amount.

In addition, the central positions and intercentral distances of the dummy patterns and the sidewall patterns can be rapidly measured using the optical misalignment inspection apparatus in the present embodiment, but a scanning electron microscope may be used instead.

As described above, in the process monitoring method of the present embodiment, the line width of the sidewall pattern can be accurately measured by measuring the changes of the central positions of the dummy patterns and the sidewall patterns, so that highly precise process control can be achieved for the line width of the sidewall pattern on the basis of the result of the measurement.

As shown in the first and second embodiments, the use of the process monitor mark having a pair of line-and-space patterns with a pitch double the pitch of the interconnect lines to be formed in the semiconductor circuit makes it possible to accurately monitor a process variation (variation in, for example, slimming, processing or sidewall thickness) caused in the pattern forming process using sidewall spacers. The result of this measurement can also be applied to process control.

As described above, according to the first and second embodiments, it is possible to provide a method of forming a process monitor mark, a process monitoring method using this mark, and a process control method using the former method wherein the process variation in the pattern forming process using sidewall spacers can be accurately monitored.

Third Embodiment

FIG. 15 is a top view of a monitor pattern (dummy pattern) according to a third embodiment. This monitor pattern corresponds to reference number 10 of the first embodiment (FIG. 3), and is a combination of wide patterns 101, micropatterns 102 having, for example, a line-and-space (L/S) of 64 nm, and a triangle pattern 103. In blocks 100a disposed on the left and upper sides of the drawing, the wide pattern 101 is formed between the micropatterns 102 with a space of 64 nm. In blocks 100b disposed on the right and lower sides of the drawing, the space between 101 and 102 and the space between 102 and 103 are set at 64 nm. The length of the pattern is, for example, 20 nm. In addition, the triangle pattern does not necessarily have to be triangle and has only to have two orthogonal sides, and its oblique side can be changed to the extent not to produce a square.

As an evaluation method, an interconnect layer (e.g., an Al or Cu layer) 2 as a first underlying layer, and an insulating layer (e.g., a silicon oxide film) 3 as a second underlying layer are first formed in order on a semiconductor substrate (e.g., a silicon substrate) 1, as shown in FIG. 15. Then, the resist patterns 101 to 103 are formed on the insulating layer 3. FIG. 16 is a sectional view corresponding to line 16-16 in FIG. 15. These resist patterns 101 to 103 are used as masks to carry out the anisotropic etching of the second underlying layer, such that a dummy pattern made from the insulating layer 3 is formed.

Figure 17:
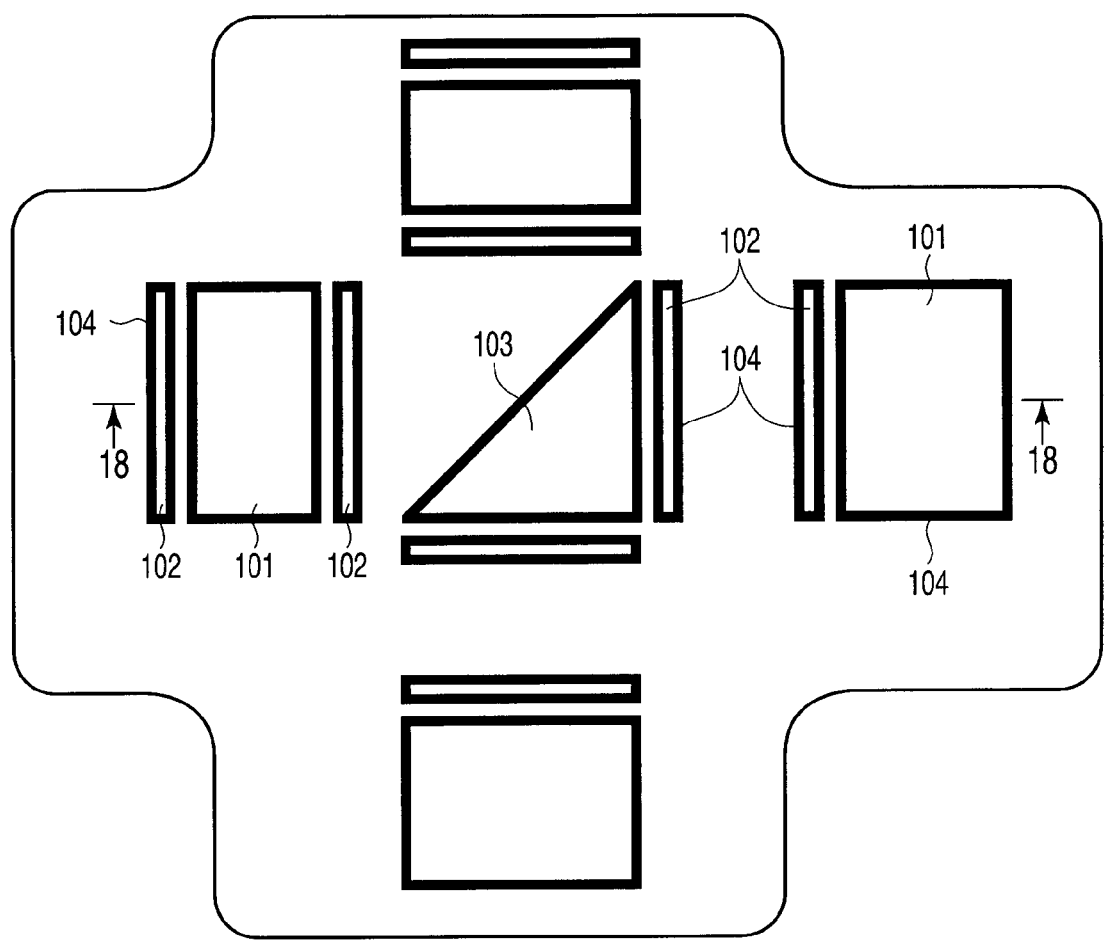
FIG. 17 is a top view of the substrate after sidewalls have been formed in an underlying layer processed by the evaluation mark (resist patterns) in FIG. 15.
Figure 18:
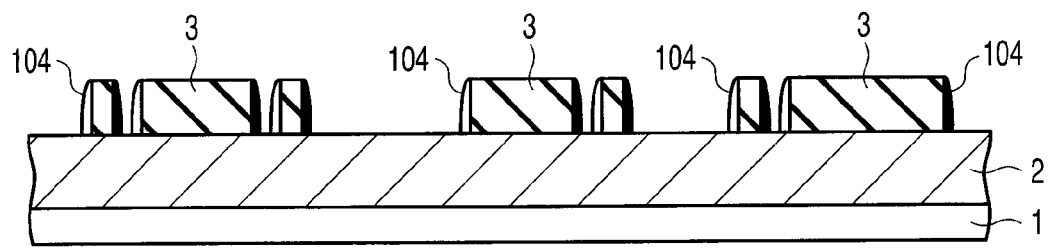
FIG. 18 is a sectional view along line 18-18 in FIG. 17.

Then, a known pattern forming process using sidewall spacers is applied to form sidewall insulators 104 on the sidewalls of the dummy pattern made from the insulating layer 3, as in FIGS. 17 and 18. For example, a silicon nitride film is used as the sidewall insulator. A sectional view along line 18-18 in FIG. 17 is shown in FIG. 18. For ease of understanding in the following explanation, the right sidewall insulators are indicated in black, and left sidewall insulators are indicated in white.

Figure 21:
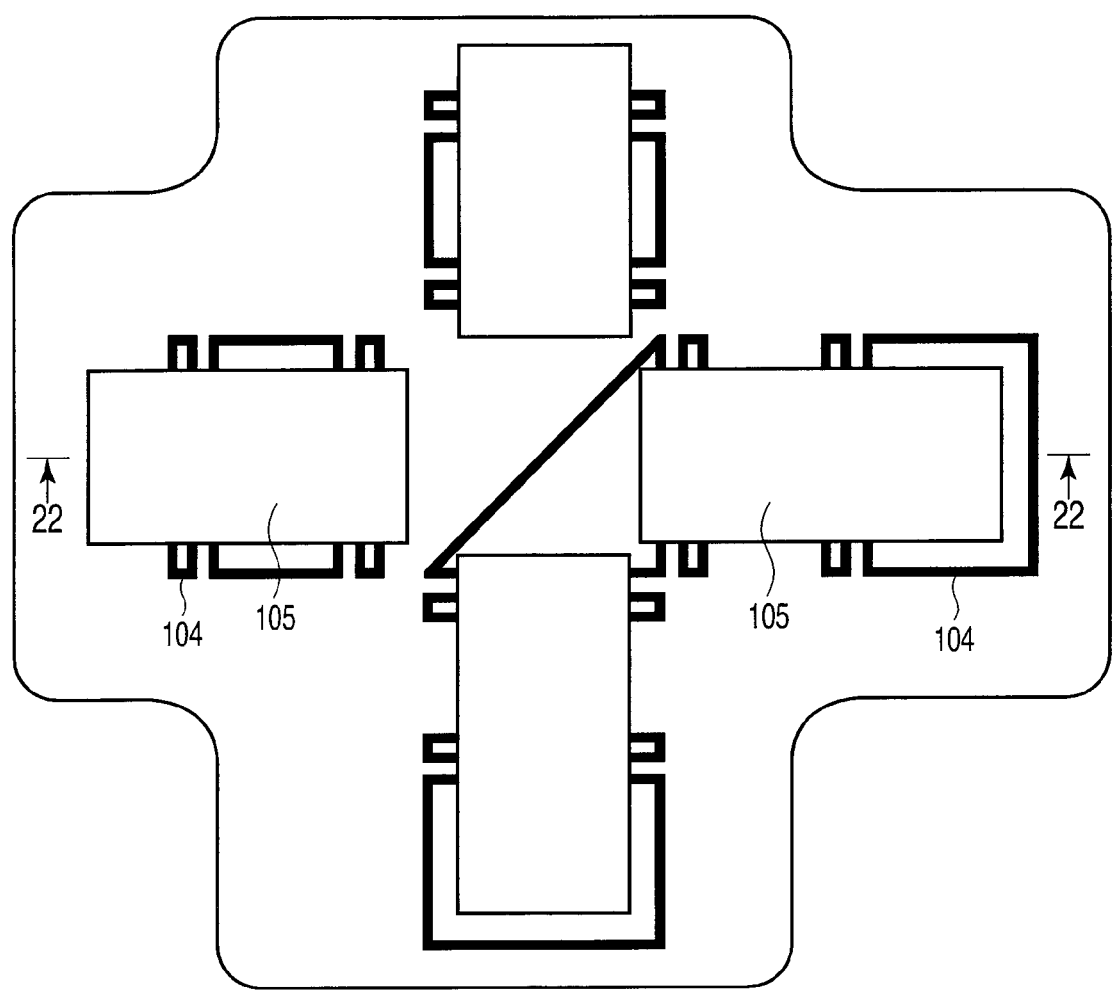
FIG. 21 is a top view after the resist patterns have been selectively formed in FIG. 19.
Figure 22:
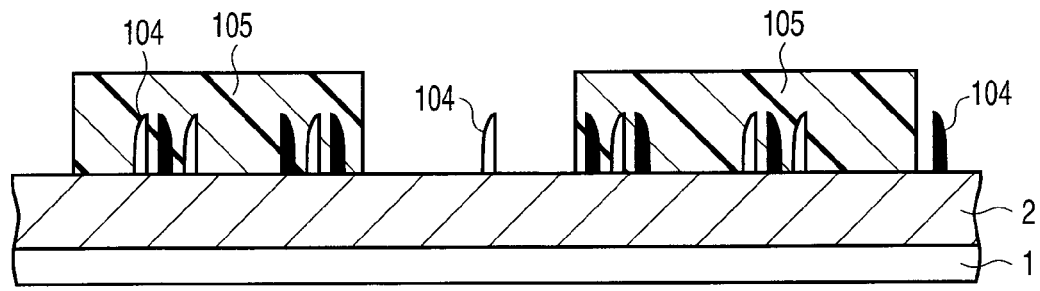
FIG. 22 is a sectional view along line 22-22 in FIG. 21.

Furthermore, as in FIG. 20, the insulating layer 3 is released, and the sidewall insulators 104 remain. Moreover, the entire surface of the substrate is coated with a resist to carry out exposure, and resist patterns 105 are formed as in FIGS. 21 and 22, and then the exposed parts of the sidewall insulators 104 are removed by etching. Further, when the resist 105 is released, the sidewall patterns shown in FIG. 23 remain on the substrate.

Figure 23:
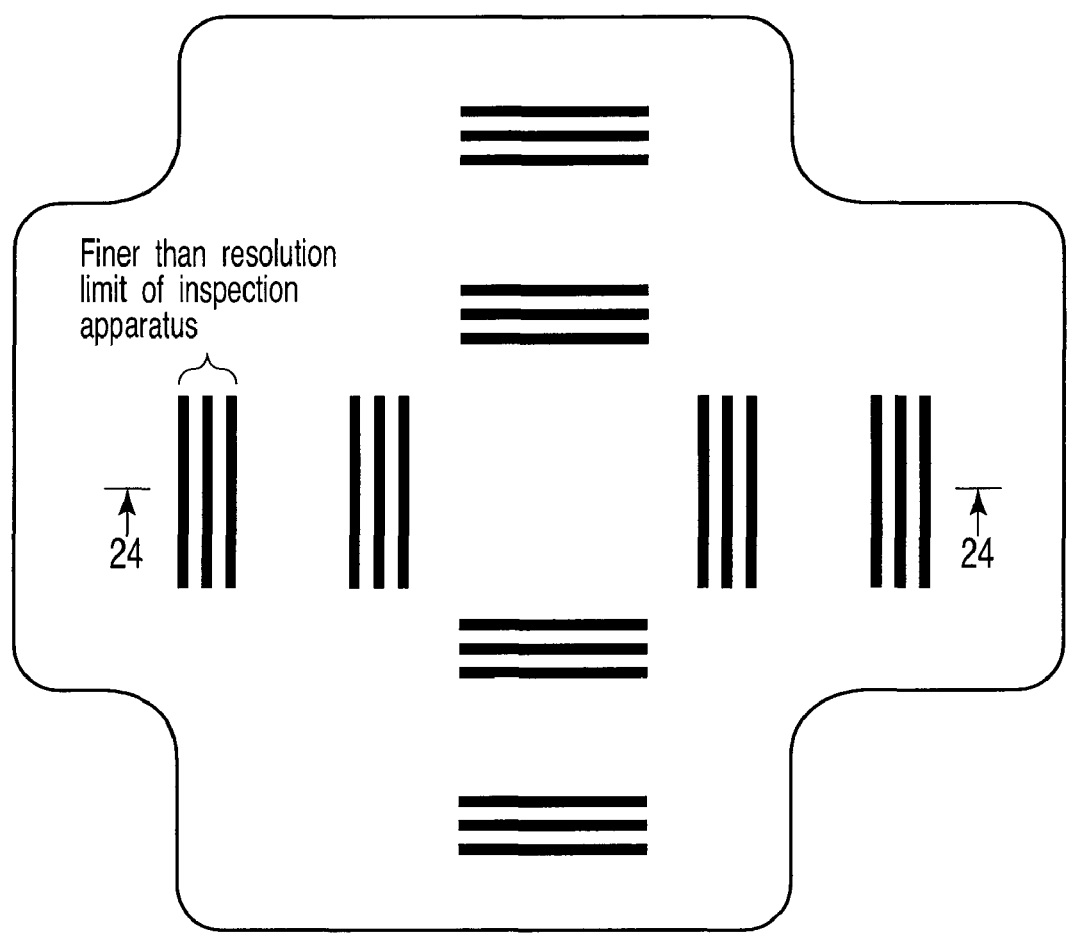
FIG. 23 is a top view after etching has been conducted in the state in FIG. 21.
Figure 24:
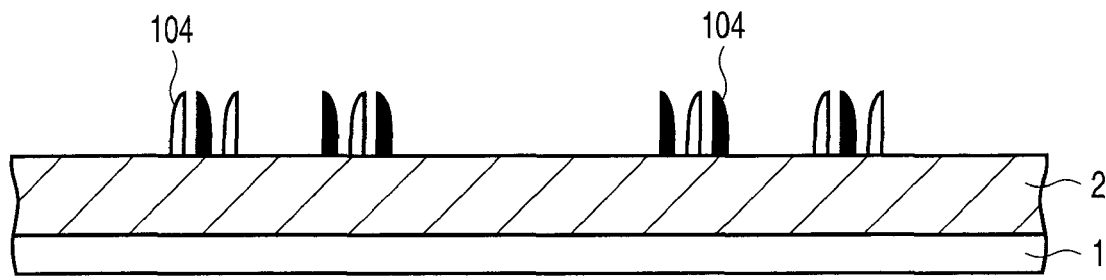
FIG. 24 is a sectional view along line 24-24 in FIG. 23.

It is to be noted here that when the monitor (dummy) pattern as shown in FIG. 15 is used to form the sidewall insulators on its sidewalls and unnecessary parts are removed, a mask composed of the sidewall insulators 104 as shown in FIGS. 23 and 24 is formed.

That is, the sidewall insulator (mask) 104 has a sectional shape composed of a curved surface and a vertical surface. The step of forming the sidewall insulators in the dummy pattern includes forming, on the sidewalls of the dummy pattern, at least a pair of first sidewall insulators having curved surfaces in a first direction and at least a pair of second sidewall insulators having curved surfaces in a second direction opposite to the first direction. The step of removing the dummy pattern includes removing the dummy pattern so that the pairs of first and second sidewall insulators remain on the second underlying layer. In addition, it has been mentioned here that the sidewall insulator (mask) has a sectional shape composed of the "curved surface" and the "vertical surface", and this expression is used for convenience to explain the embodiment in a more easily understandable manner, and it goes without saying that the sectional shape is not exactly as illustrated in the drawings in an actual manufacturing process.

Figure 25:
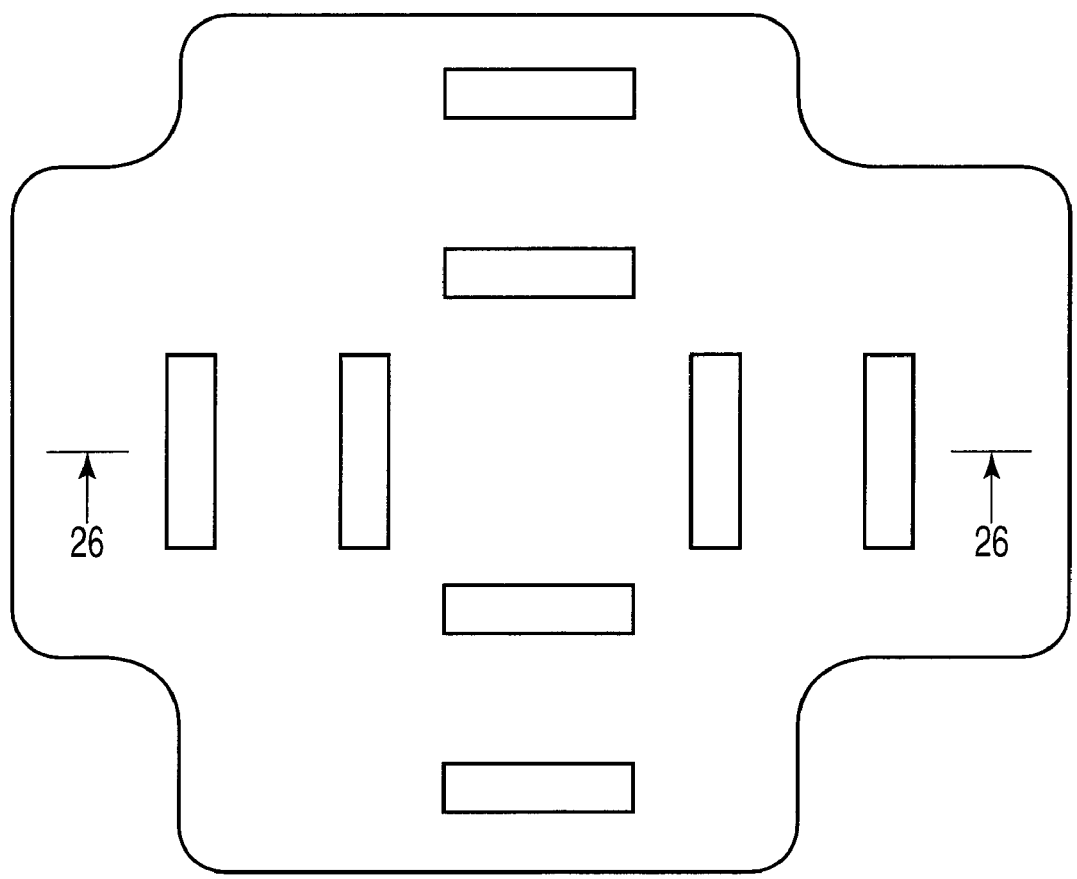
FIG. 25 is an inspection image in the case where the state in FIG. 23 is provided to an inspection apparatus.
Figure 26:
FIG. 26 is a profile of the inspection image along line 26-26 in FIG. 25.
Figure 30A:
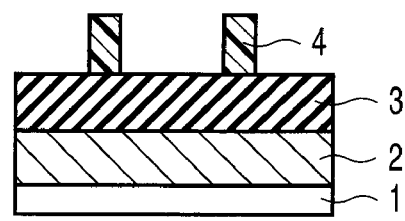
FIGS. 30A to 30E are sectional views of a mark showing stepwise an evaluation mark manufacturing method according to a fourth embodiment.
Figure 30B:
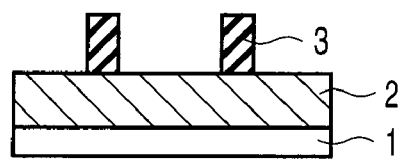
Figure 30C:
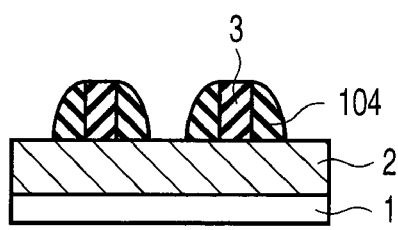
Figure 30D:
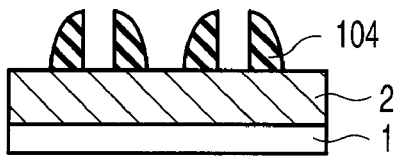
Figure 30E:
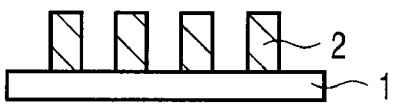

The sidewall pattern including the first and second sidewall insulators obtained as described above is inspected using a general optical misalignment inspection apparatus. As the period of micropatterns formed by the sidewalls in FIG. 23 is equal to or less than the resolution of the microscope of the inspection apparatus, a measurement image is as shown in FIG. 25. In the measurement image, there are an "inner mark" comprising four inner rectangles and an "outer mark" comprising four outer rectangles. It is to be noted here that the outer shape of the inner mark is defined by the sidewall insulators indicated in black and the outer shape of the outer mark is defined by the sidewall insulators indicated in white. FIG. 26 is a profile of the measurement image along line 26-26 in FIG. 25.

FIG. 27 shows a change in the measurement image in the case where the dimensions (critical dimension [CD]) of the sidewall pattern spaces alternately change in the sidewall process. The inner mark and the outer mark are different from each other in the sidewall patterns defining the edges of these marks in the measurement image, and the inner mark and the outer mark shift in opposite directions as shown in FIG. 29 along with the alternate CD variations. In addition, FIG. 29 is a profile of the measurement image in FIG. 28. Shift of the measurement image on the left side of FIG. 29 is same as that of A1" and A2" in FIG. 1C, and shift of the measurement image on the right side of FIG. 29 is same as that of B1" and B2" in FIG. 12C. When the intercentral distance of the image on the left side and the intercentral distance of the image on the right side is measured by the optical misalignment inspection apparatus, a dimensional error attributed to a problem in the pattern forming process using sidewall spacers is found out.

As described above, the micro repetitive patterns are formed by the pattern forming technique using sidewall spacers in the third embodiment. That is, an evaluation mark composed of the inner mark and the outer mark is formed by use of the pattern forming process using sidewall spacers so that the alternate CD change may be the difference between the relative positions of the inner mark and the outer mark. The incidence of the CD change made every other repetitive pattern can be readily evaluated at high speed using the general optical misalignment inspection apparatus, so that the result can be fed back to a manufacturing condition of the semiconductor device in a short time.

Fourth Embodiment

While a CD change is measured using the sidewall insulators 104 of the insulating layer pattern 3 in the third embodiment, the CD change may be measured using a process pattern of the interconnect layer 2 which is the underlying layer of the insulating layer pattern 3.

FIGS. 30A to 30E are sectional views of an evaluation substrate showing a monitor pattern forming method according to a fourth embodiment. That is, as in the third embodiment, an interconnect layer 2 is formed on a semiconductor substrate 1, on which an insulating layer 3 is formed. A resist pattern 4 is formed on the insulating layer 3, and this resist pattern 4 is used as a mask to carry out the anisotropic etching of the insulating layer 3. Sidewall insulators 104 are formed in the obtained insulating layer pattern 3, and then the insulating layer pattern 3 is removed. Further, the sidewall insulators 104 are used as masks to carry out the anisotropic etching of the interconnect layer 2, thereby obtaining a monitor mark formed of the interconnect layer 2.

In the case described above, if the resist pattern 4 is configured as in FIG. 3 in the first embodiment, a measurement as in the third embodiment can be made using the interconnect layer pattern 2 as the monitor mark, so that similar effects can be provided.

Here, the monitor mark obtained in the fourth embodiment includes first and second marks (FIG. 30E), wherein the first and second marks are formed by etching an underlying layer formed on a semiconductor substrate by use of a first mask and a second mask (FIG. 30D), the first mask being composed of a pair of first linear patterns having a first side surface which includes a vertical surface, and a second side surface which includes a curved surface and which is parallel to the first side surface, the second mask being composed of a pair of second linear patterns having a third side surface which is opposite to and parallel to the second side surface of the first linear patterns, and a fourth side surface which includes a vertical surface and which is parallel to the third side surface.

Fifth Embodiment

While a set of L/S patterns of 64 nm is arranged on two orthogonal side surfaces of the wide pattern 101 or the triangle pattern 103 in the monitor mark of the third embodiment, a large number of micro L/S patterns may be provided. The fifth embodiment concerns such a configuration.

Figure 31:
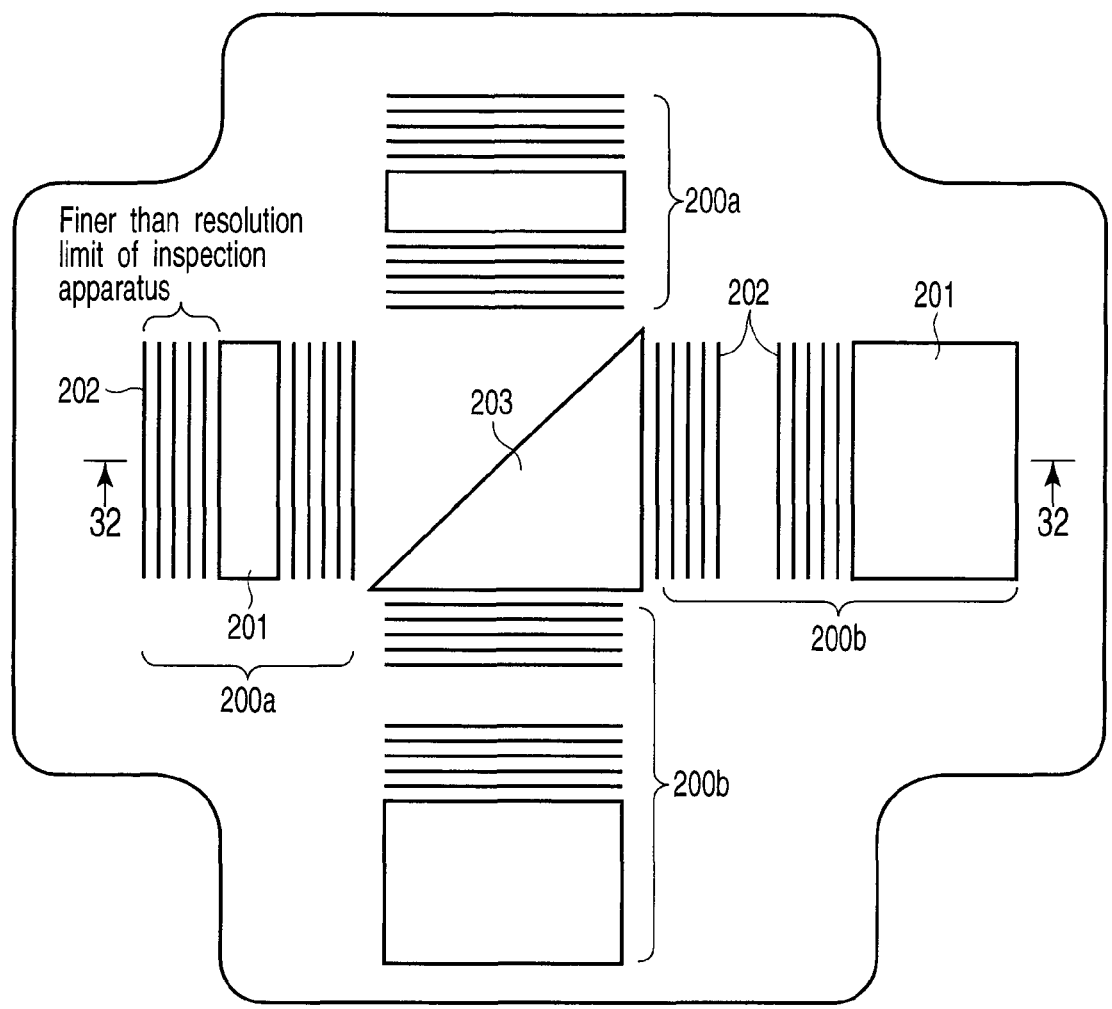
FIG. 31 is a top view of an evaluation mark according to a fifth embodiment.
Figure 32:
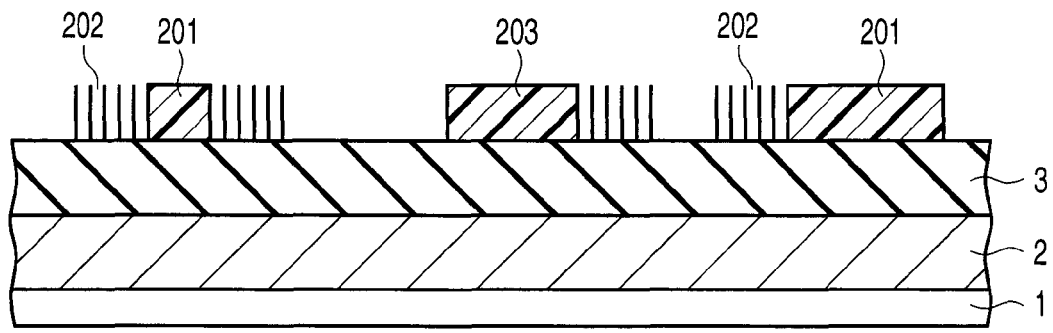
FIG. 32 is a sectional view of a semiconductor device substrate in the case where the evaluation mark in FIG. 31 is applied to the resist patterns in a substrate for forming a film to be processed, and corresponds to a section of the substrate along line 32-32 in FIG. 31.

That is, in the fifth embodiment, a wide pattern 201 is formed between a plurality of micropatterns 202 with a space of, for example, 64 nm in blocks 200a disposed on the left and upper sides of the drawing, as shown in FIG. 31. In blocks 200b disposed on the right and lower sides of the drawing, a plurality of micropatterns 202 are formed with a space of 64 nm adjacently to the wide patterns 201 and a triangle pattern 203. The length of the pattern is, for example, 20 nm. FIG. 32 is a sectional view along line 32-32 in FIG. 31, in which the same numbers are assigned to the same parts as those in the third embodiment and such parts are not repeatedly explained.

Figure 33:
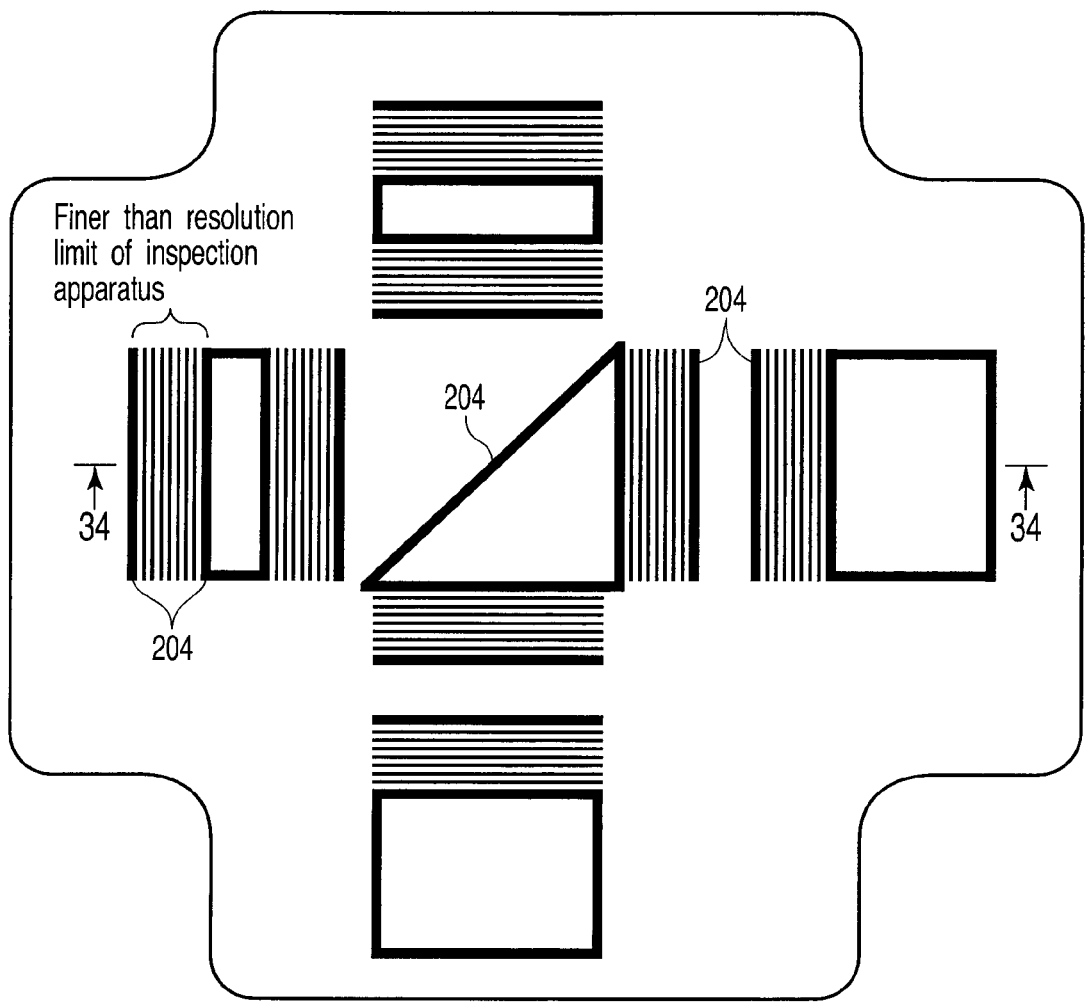
FIG. 33 is a top view of the substrate after sidewalls have been formed in an underlying layer processed by the evaluation mark (resist patterns) in FIG. 31.
Figure 34:
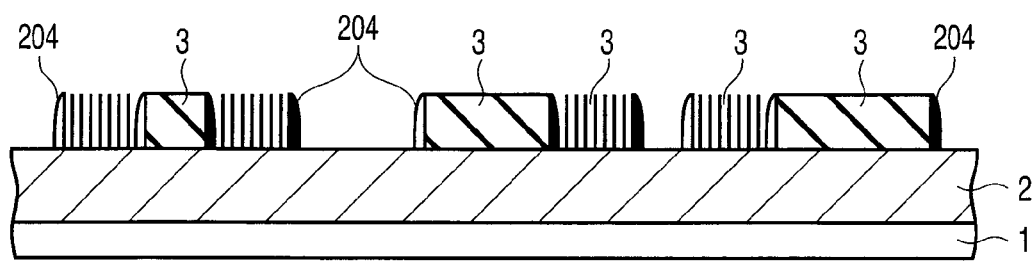
FIG. 34 is sectional view of the substrate along line 34-34 in FIG. 33.

After the above-mentioned resist patterns 201 to 203 have been formed on an insulating layer 3, the well-known pattern forming process using sidewall spacers is applied to form sidewall insulators 204 on the sidewalls of the insulating layer 3, as in FIG. 33. For example, a silicon nitride film is used as the sidewall insulator.

Furthermore, the insulating layer 3 is removed, and the sidewall insulators 204 remain. Moreover, the entire surface of a substrate is coated with a resist to carry out exposure, and resist patterns 205 are formed as in FIG. 35, and then the exposed parts of the sidewall insulators 204 are removed by etching. Further, when the resist patterns 205 are removed, the sidewall patterns 204 shown in FIG. 36 remain on the substrate.

Figure 35:
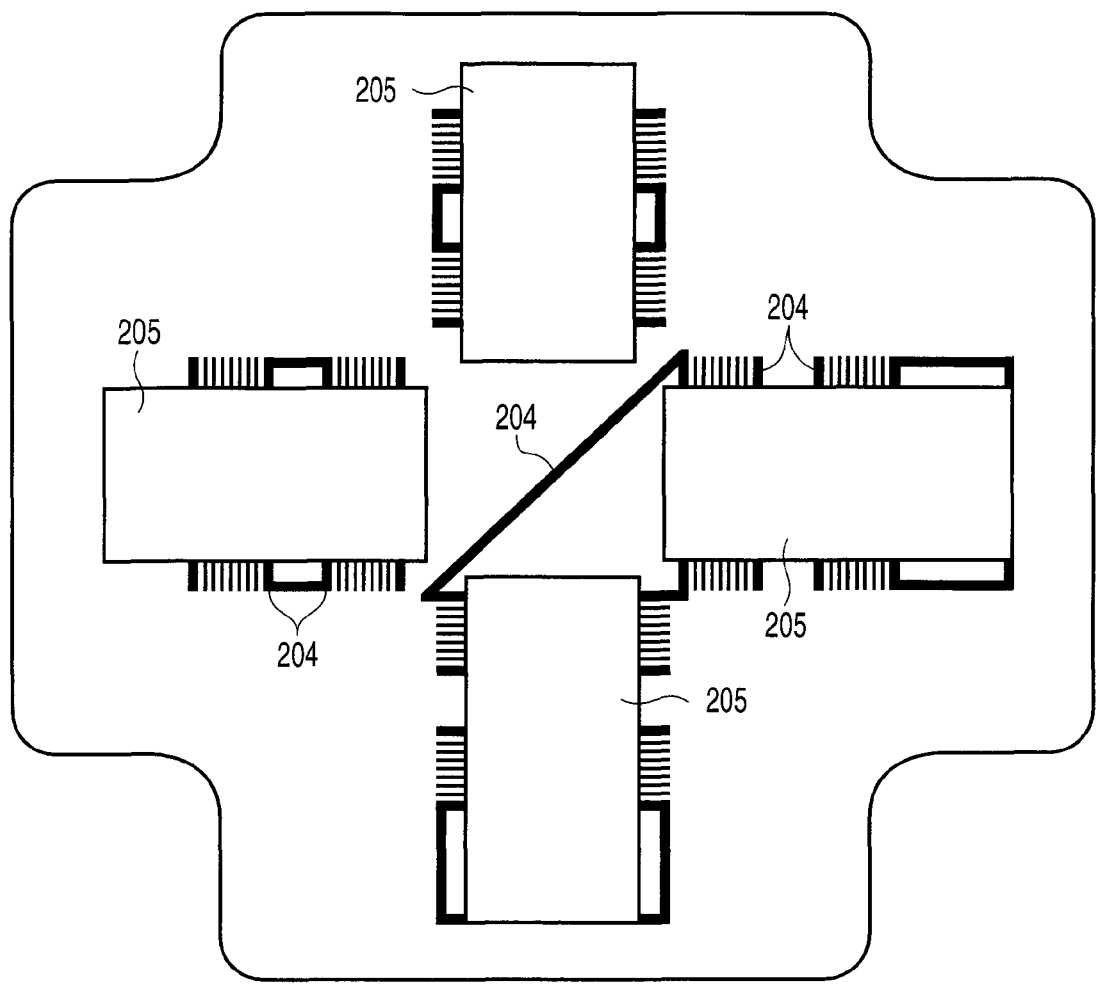
FIG. 35 is a top view of the substrate in which the resist patterns are selectively formed after the resist in FIG. 33 has been removed.
Figure 36:
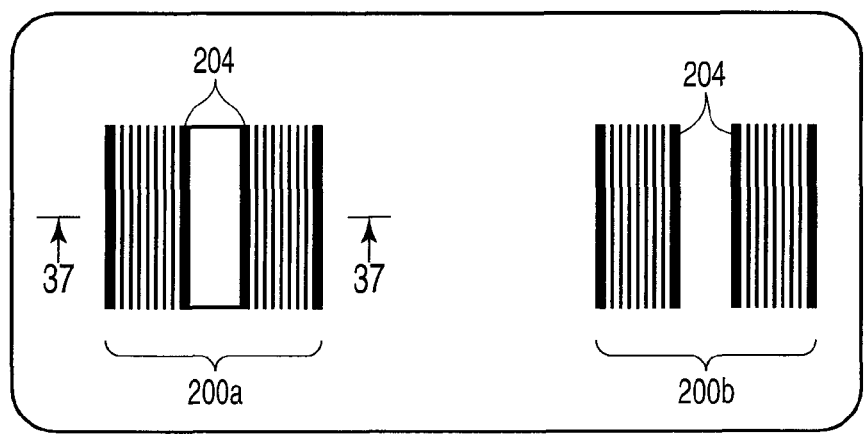
FIG. 36 is a top view of right and left patterns alone after the resist in FIG. 35 has been removed wherein top and bottom pattern groups are not illustrated.
Figure 37:
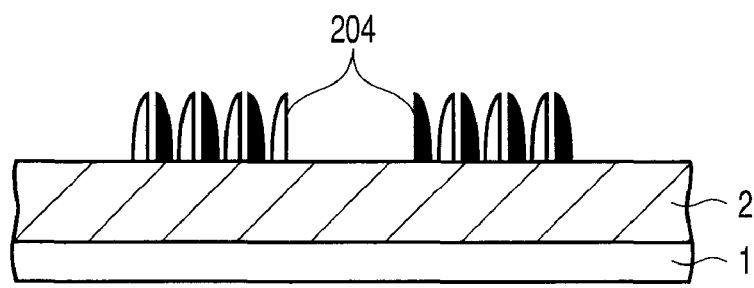
FIG. 37 is a sectional view along line 37-37 in FIG. 36.

In addition, FIG. 36 is a diagram in which horizontally opposite patterns in FIG. 35 alone are extracted. Moreover, the sidewall patterns 204 are formed in each of the micropatterns, and outermost peripheral patterns alone are indicated by thick lines in FIGS. 33 to 36. A detailed sectional view along line 37-37 in FIG. 36 is shown in FIG. 37. The sidewall insulators 204 are thus formed.

The pattern formed by the sidewall insulators 204 obtained as described above is inspected using a general optical misalignment inspection apparatus. As the period of micropatterns formed by the sidewall insulators 204 shown in FIG. 37 is equal to or less than the resolution of the microscope of the inspection apparatus, a measurement image is as shown in FIG. 25. That is, in the measurement image, there are an "inner mark" comprising four inner rectangles and an "outer mark" comprising four outer rectangles.

Figure 38:
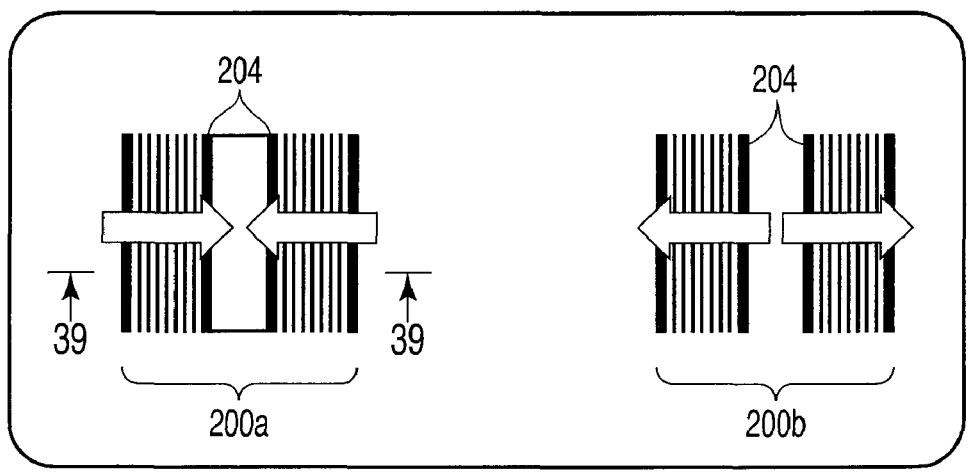
FIG. 38 is a schematic top view showing the shift direction of a group of micropatterns in the case where space changes every other sidewall pattern.
Figure 39:
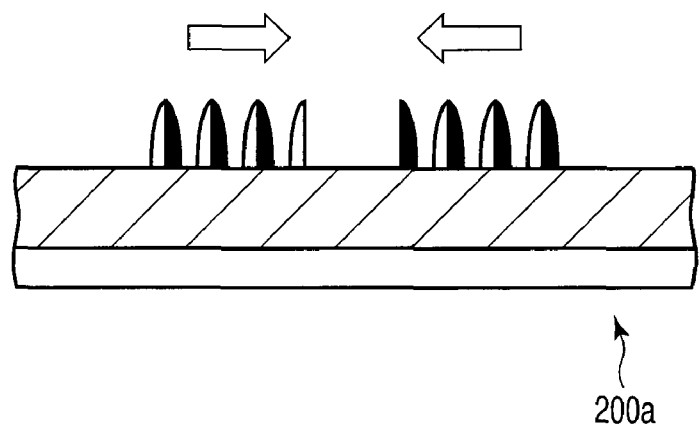
FIG. 39 is a sectional view along line 39-39 in FIG. 38.

FIG. 38 shows the change of the measurement image in the case where the CDs of the sidewall patterns change every other sidewall pattern in the sidewall process. The inner mark and the outer mark are different from each other in the sidewall patterns defining the edges of these marks in the measurement image, so that the inner mark and the outer mark shift in opposite directions as shown in FIG. 38 along with the alternate CD variations. Shift of the measurement image 200a on the left side of FIG. 38 is same as that of A1" and A2" in FIG. 11C of the second embodiment, and shift of the measurement image on the right side of FIG. 38 is same as that of B1" and B2" in FIG. 12C of the second embodiment. When the intercentral distance of the image on the left side and the intercentral distance of the image on the right side is measured by the optical misalignment inspection apparatus, a dimensional error attributed to a problem in the pattern forming process using sidewall spacers is found out.

As described above, a group of micro repetitive patterns are formed by the pattern forming technique using sidewall spacers in the third embodiment. That is, as in third embodiment, the a monitor mark composed of the inner mark and the outer mark is formed by use of the pattern forming process using sidewall spacers so that the alternate CD change may be the difference between the relative positions of the inner mark and the outer mark. The incidence of the CD change made at this point every other repetitive pattern can be readily evaluated at high speed using the general optical misalignment inspection apparatus, so that the result can be fed back to a manufacturing condition of the semiconductor device in a short time.

Sixth Embodiment

The third to fifth embodiments have used the evaluation mark similar to a so-called bar-in-bar type used in a misalignment inspection. The present invention is not limited to this, and a box-in-box type evaluation mark can also be used. In a sixth embodiment, such an example is described.

FIG. 40 is a top view of a monitor pattern (dummy pattern) used in the sixth embodiment. In a central small square, a triangle pattern 303 which connects opposing corners to divide the square into two is formed. A large square is formed to enclose the small square, and a plurality of line-and-space (L/S) micropatterns are circularly formed in parallel to each other in a circular part enclosed by the squares. Arrows in the drawing indicate the longitudinal directions of the L/S. Wide patterns 301 are formed on the right and upper sides of the large square.

In addition, the triangle pattern 303 and the wide patterns 301 are dotted for ease of understanding, but these patterns are actually not dotted, and are dotted for convenience to clearly indicate the regions. Moreover, rectangles may be used instead of the squares, and the triangle pattern does not necessarily have to be triangle, as in the third embodiment.

Figure 42A:
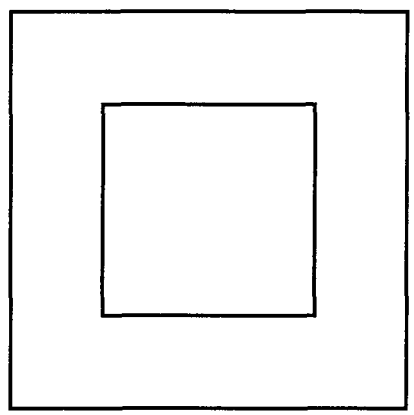
FIG. 42A is a normal inspection image in the sixth embodiment.
Figure 42B:
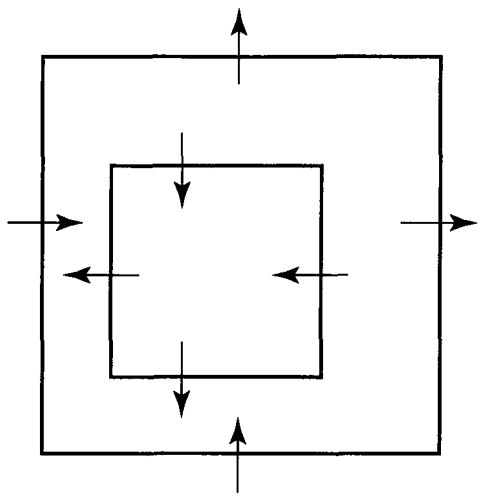
FIG. 42B is an inspection image in the case where space alternately changes in the sixth embodiment.

Steps similar to those in FIGS. 5 to 12 in the third embodiment are carried out using the above-mentioned monitor (dummy) pattern. FIG. 41 is a sectional view of sidewalls along line 41-41 in FIG. 40, and shows the change of a measurement image in the case where the dimensions (CDs) of the sidewall patterns change every other sidewall pattern in a sidewall forming process. That is, on the right and left sides of the circular pattern, a group of patterns shift in opposite directions as indicated by arrows. When this displacement is measured by an optical misalignment inspection apparatus, inspection images as shown in FIGS. 42A and 42B are obtained. FIG. 42A shows a normal case, and FIG. 42B shows a case where the pattern has been displaced. Thus, as in the third embodiment, it is possible to detect a dimensional error attributed to a problem in the pattern forming process using sidewall spacers.

As described above, in the sixth embodiment, a group of micro repetitive patterns are formed in a box-in-box type by the pattern forming technique using sidewall spacers so that the alternate CD change may be the difference between the relative positions of the right side and the left side (alternatively, the upper side and the lower side). The incidence of the CD change made at this point every other repetitive pattern can be readily evaluated at high speed using the general optical misalignment inspection apparatus, so that the result can be fed back to a manufacturing condition of the semiconductor device in a short time.

Seventh Embodiment

Figure 43:
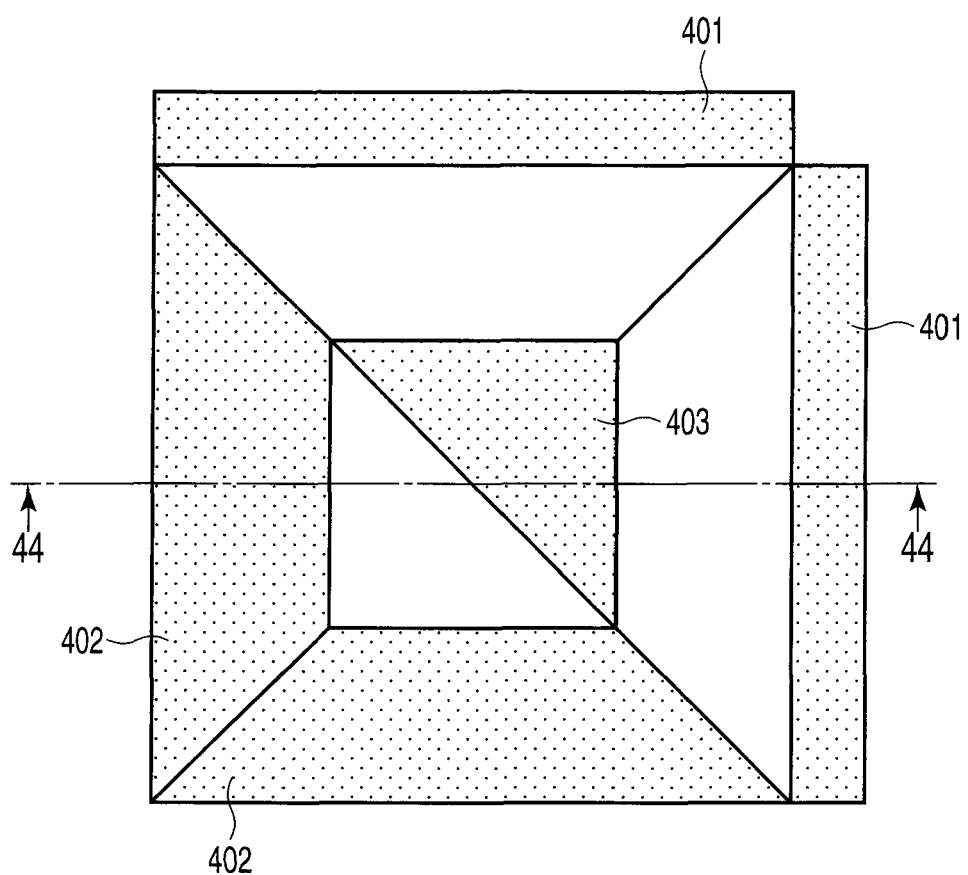
FIG. 43 is a top view of an evaluation mark according to a seventh embodiment.

While a plurality of micropatterns 302 are formed in the circular part in the box in the sixth embodiment, these patterns can be wide patterns. FIG. 43 is a top view of a monitor (dummy) mark according to a seventh embodiment. This embodiment is different from the sixth embodiment in that parts which are not in contact with a triangle pattern 403 are used as wide patterns 402 in a circular part in a box. Patterns indicated by 401 are also wide patterns. This evaluation mark can be said to be a modification of the bar-in-bar type in the third embodiment.

Figure 44:
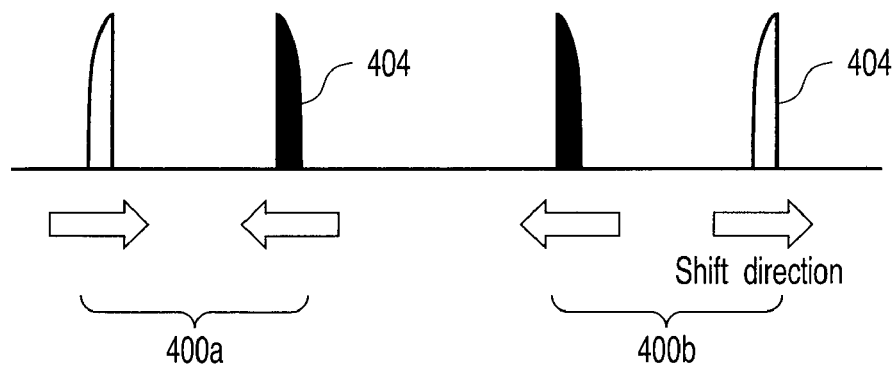
FIG. 44 is a schematic sectional view of sidewalls showing the shift direction of a group of sidewall micropatterns on line 44-44 in FIG. 43.
Figures 45A, 45B:
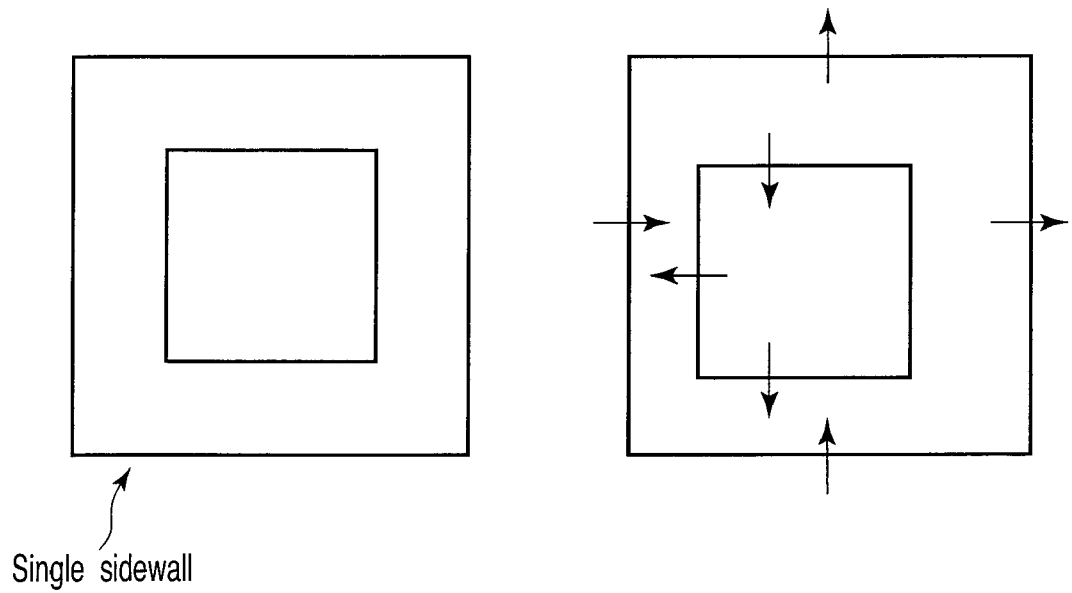
FIG. 45A is a normal inspection image in the seventh embodiment.
FIG. 45B is an inspection image in the case where space alternately changes in the seventh embodiment.

Steps similar to those in FIGS. 17 to 24 in the third embodiment are carried out using the above-mentioned monitor pattern. FIG. 44 is a sectional view of sidewalls along line 44-44 in FIG. 43, and shows the change of a measurement image in the case where the dimensions (CDs) of the sidewall patterns change in a sidewall forming process. In the present embodiment, four sidewall patterns are only observed, and two right patterns and two left patterns in the circular pattern part shift in opposite directions. When this displacement is measured by an optical misalignment inspection apparatus, inspection images as shown in FIGS. 45A and 45B are obtained. FIG. 45A shows a normal case, and FIG. 45B shows a case where the pattern has been displaced. Thus, as in the third embodiment, it is possible to detect a dimensional error attributed to a problem in the pattern forming process using sidewall spacers.

As described above, in the seventh embodiment, sidewall patterns are formed in a bar-in-bar type formed by the wide patterns alone in accordance with the pattern forming technique using sidewall spacers so that the alternate CD change may be the difference between the relative positions of the right side and the left side (alternatively, the upper side and the lower side). The incidence of the CD change of the sidewall patterns made at this point every other repetitive pattern can be readily evaluated at high speed using the general optical misalignment inspection apparatus, so that the result can be fed back to a manufacturing condition of the semiconductor device in a short time.

In the six and seventh embodiments described above, the monitor (dummy) pattern as shown in FIG. 40 or 43 is used to form sidewall insulators on its sidewalls. When unnecessary parts are removed, masks made of the sidewall insulators 304 or 404 as shown in FIG. 41 or 44 are formed. That is, the sidewall insulator (mask) 304 or 404 has a sectional shape composed of a curved surface and a vertical surface. The step of forming the sidewall insulators in the dummy pattern includes forming, on the sidewalls of the dummy pattern, at least a pair of first sidewall insulators having curved surfaces in a first direction and at least a pair of second sidewall insulators having curved surfaces in a second direction opposite to the first direction. The step of removing the dummy pattern includes removing the dummy pattern so that the pairs of first and second sidewall insulators 304 and 404 remain on the second underlying layer.

Eighth Embodiment

Figure 46:
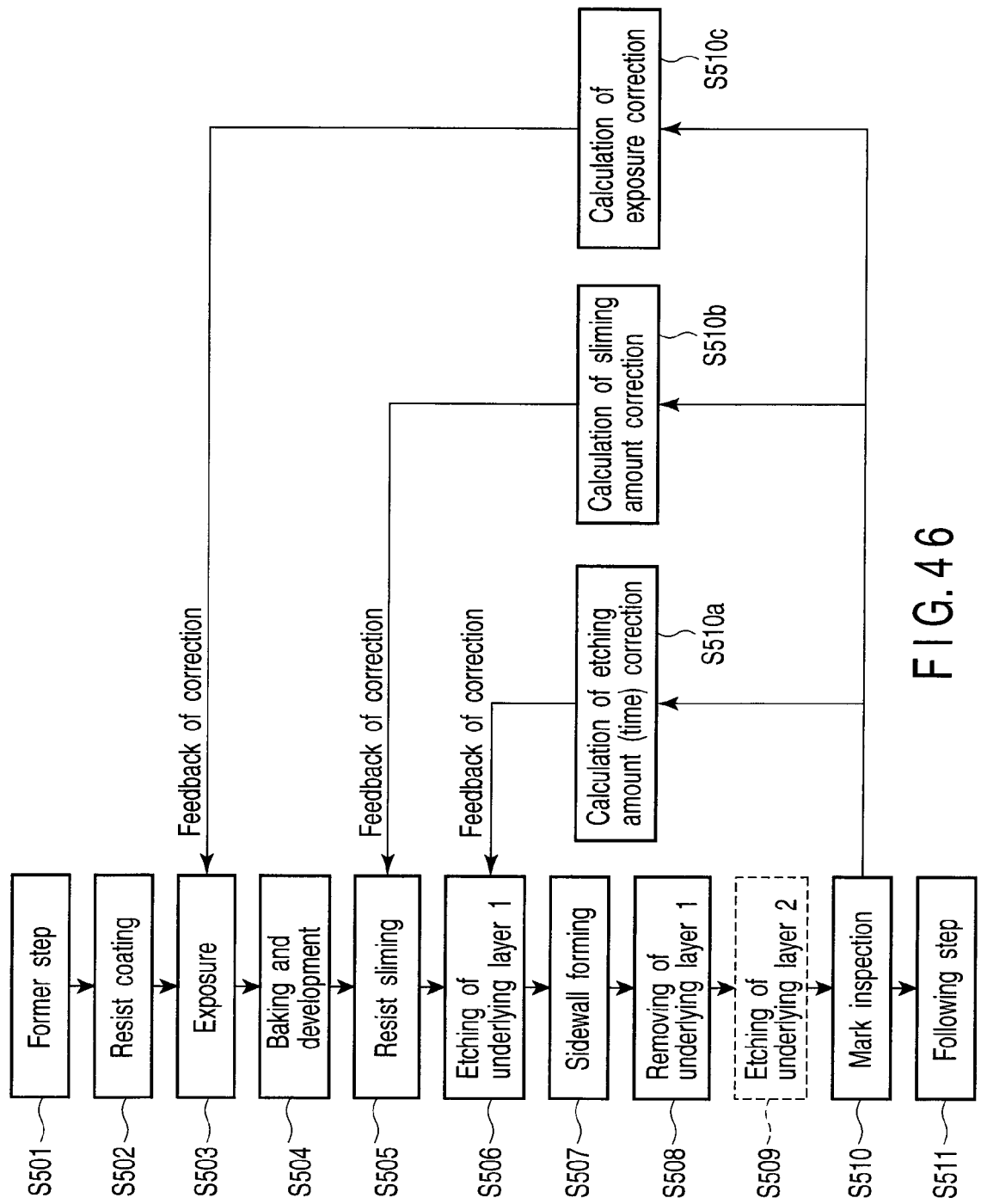
FIG. 46 is a process chart of a semiconductor device according to an eighth embodiment.

In the eighth embodiment, an embodiment is described where the pattern monitor (evaluation) method described in the third to seventh embodiments is applied to a semiconductor device manufacturing method. FIG. 46 is a flowchart for explaining the semiconductor device manufacturing method according to the eighth embodiment. Although the line-and-space interconnect pattern has been described as an example in the third to sixth embodiments, the present invention is not limited to the interconnect pattern. In the eighth embodiment, while steps corresponding to FIGS. 15 to 24 in the third embodiment are also employed, a layer indicated by the reference number 3 is referred to as an underlying layer 1, and a layer indicated by the reference number 2 is referred to as an underlying layer 2. Moreover, these steps are inserted into various parts in the semiconductor manufacturing process, a step immediately before these steps are inserted is defined as a former step, and a step immediately after is defined as the following process.

First, a semiconductor substrate being processed is accepted in the former step (S501), and the random inspection with a monitor mark is conducted. This may otherwise be carried out as a preliminary test. The substrate being processed is coated with a resist (S502), and exposed through a mask (S503). This substrate is baked and developed (S504), and the resist is slimmed (S505). This step can be omitted when there is no particular need to thin the resist.

Next, the underlying layer 1 is etched using the resist pattern formed by the development/slimming (S506), and a sidewall is formed (S507). This sidewall is used as a mask to selectively remove (anisotropically etch) the underlying layer 1 (S509). The substrate in which a monitor mark has been formed by the etching undergoes the inspection of the monitor mark (S510), and if the substrate passes the inspection, the flow proceeds to the following step (S511).

If the substrate is rejected in the monitor mark inspection (S510), the cause is tracked down. When the amount (time) of etching should be corrected, a correction amount is calculated and fed back to the etching step (S506) of the underlying layer 1 (S510a). When the amount of slimming should be corrected, a correction value is calculated and fed back to the slimming step (S505) of the resist (S510b). When the amount of exposure should be corrected, a correction value is calculated and fed back to the exposure step (S503).

As described above, according to the eighth embodiment, it is possible to detect a problem condition by the inspection of the monitor mark in a short time, a correction value can be rapidly fed back to the manufacturing condition of the semiconductor device.

According to the third to eighth embodiments described above, it is possible to far more readily measure and evaluate a dimensional error attributed to a problem in the pattern forming process using sidewall spacers than in the case of using an SEM. When a semiconductor device is manufactured using the pattern monitor mark and the pattern monitor method of the present invention, an efficient process can be established.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A process monitoring method comprising:
preparing a monitor mark by forming an insulating film on a semiconductor substrate and forming a first repetitive line pattern group and a second repetitive line pattern group by patterning the insulating film on the semiconductor substrate, such that the first repetitive line pattern group and the second repetitive line pattern group face each other with a predetermined space therebetween;

measuring a first intercentral distance between the first and second repetitive line pattern groups;

slimming line patterns of the first and second repetitive line pattern groups;

measuring a second intercentral distance between the first and second repetitive line pattern groups after said slimming; and calculating a variation between the first and second intercentral distances.

2. The method according to claim 1, wherein said measuring the first and second intercentral distances between the first and second repetitive line pattern groups includes using an optical misalignment inspection apparatus.

3. The method according to claim 1, further comprising controlling the slimming in accordance with the dimensional variation attributed to the slimming to produce a desired dimensional variation.

4. A method of process monitoring comprising:

preparing a monitor mark by forming an insulating film on a semiconductor substrate and forming a first repetitive line pattern group and a second repetitive line pattern group by patterning the insulating film on the semiconductor substrate, such that the first repetitive line pattern group and the second repetitive line pattern group face each other with a predetermined space therebetween;

measuring a first intercentral distance between the first and second repetitive line pattern groups;

forming sidewall patterns on sidewalls of patterns included in the first and second repetitive line pattern groups;

removing the insulating film after said forming the sidewall patterns, thereby forming a third repetitive line pattern group and a forth repetitive line pattern group, which are made of the sidewall patterns;

measuring a second intercentral distance between the third and fourth repetitive line pattern groups, after said removing the insulating film; and calculating a variation between the first and second intercentral distances.

5. The method according to claim 4, wherein said measuring the first and second intercentral distances includes using a optical misalignment inspection apparatus.

6. The method according to claim 4, further comprising:

calculating a line width of the sidewall patterns based on the variation between the first and second intercentral distances; and controlling said forming the sidewall patterns to produce a desired line width in accordance with said calculating a line width.

7. The method according to claim 4, wherein the third and fourth repetitive line pattern groups are groups of line patterns including curved surfaces and vertical surfaces, first line patterns having the curved surfaces facing a first direction are provided on both sides of the third repetitive line patterns, and second line patterns having the curved surfaces facing a second direction different from the first direction on both sides of the fourth repetitive line patterns.

8. The method according to claim 4, wherein the first and second repetitive line pattern groups have the same line pitch.

9. The according to claim 4, wherein said measuring the intercentral distances includes recognizing each of the repetitive line groups as a group, and measuring relative positions thereof.

* * * * *